United States Patent
Hwang et al.

(10) Patent No.: US 12,378,472 B2
(45) Date of Patent: Aug. 5, 2025

(54) QUANTUM DOT, PRODUCTION METHOD THEREOF, AND ELECTRONIC DEVICE INCLUDING THE SAME

(71) Applicant: SAMSUNG ELECTRONICS CO., LTD., Suwon-si (KR)

(72) Inventors: Sungwoo Hwang, Suwon-si (KR); Soo Kyung Kwon, Suwon-si (KR); Yong Wook Kim, Yongin-si (KR); Seon-Yeong Kim, Suwon-si (KR); Ji-Yeong Kim, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 790 days.

(21) Appl. No.: 17/502,542

(22) Filed: Oct. 15, 2021

(65) Prior Publication Data
US 2022/0119705 A1  Apr. 21, 2022

(30) Foreign Application Priority Data
Oct. 16, 2020 (KR) .......... 10-2020-0134708

(51) Int. Cl.
| C09K 11/88 | (2006.01) |
| C09K 11/02 | (2006.01) |
| C09K 11/08 | (2006.01) |
| C09K 11/56 | (2006.01) |
| C09K 11/70 | (2006.01) |
(Continued)

(52) U.S. Cl.
CPC .......... *C09K 11/883* (2013.01); *C09K 11/025* (2013.01); *G02F 1/133617* (2013.01); *H10K 50/115* (2023.02); *B82Y 20/00* (2013.01); *B82Y 40/00* (2013.01)

(58) Field of Classification Search
CPC ..... C09K 11/02; C09K 11/883; C09K 11/025; C09K 11/0811; C09K 11/0827; C09K 11/56; C09K 11/612; C09K 11/615; C09K 11/626; C09K 11/664; C09K 11/703;
(Continued)

(56) References Cited

U.S. PATENT DOCUMENTS

| 8,633,040 B2 | 1/2014 | Novichkov et al. |
| 9,284,484 B2 | 3/2016 | Jang et al. |
(Continued)

FOREIGN PATENT DOCUMENTS

| JP | 2007284284 A | 11/2007 |
| JP | 2012500175 A | 1/2012 |
(Continued)

OTHER PUBLICATIONS

Machine translation of KR20180077086A, 61 pages. (Year: 2018).*
(Continued)

*Primary Examiner* — Matthew E. Hoban
*Assistant Examiner* — Lynne Edmondson
(74) *Attorney, Agent, or Firm* — CANTOR COLBURN LLP

(57) ABSTRACT

Provided is a quantum dot having a core-shell structure, wherein a core includes a first semiconductor nanocrystal including zinc, tellurium, and selenium, and a semiconductor nanocrystal shell is disposed on the core and includes a Group II-VI compound, wherein the quantum dot further includes phosphorus and fluorine, and the quantum dot does not include cadmium.

19 Claims, 14 Drawing Sheets

(51) Int. Cl.
*C09K 11/72* (2006.01)
*G02F 1/13357* (2006.01)
*H10K 50/115* (2023.01)
*B82Y 20/00* (2011.01)
*B82Y 40/00* (2011.01)

(58) Field of Classification Search
CPC ... C09K 11/705; C09K 11/722; H01L 33/502; H10K 50/115; B82Y 20/00
See application file for complete search history.

(56) References Cited

U.S. PATENT DOCUMENTS

| | | | |
|---|---|---|---|
| 9,482,618 | B2 | 11/2016 | Suh et al. |
| 10,446,782 | B1 | 10/2019 | Han et al. |
| 10,559,712 | B2 * | 2/2020 | Park .................... H01L 33/34 |
| 10,808,174 | B2 | 10/2020 | Park et al. |
| 10,954,440 | B2 | 3/2021 | Won et al. |
| 11,268,022 | B2 | 3/2022 | Ippen et al. |
| 11,566,345 | B2 | 1/2023 | Kim et al. |
| 11,591,518 | B2 | 2/2023 | Won et al. |
| 11,692,136 | B2 * | 7/2023 | Kim .................... C01G 9/08 257/40 |
| 11,981,852 | B2 | 5/2024 | Won et al. |
| 11,982,018 | B2 | 5/2024 | Kim et al. |
| 2017/0052444 | A1 | 2/2017 | Park et al. |
| 2018/0094190 | A1 | 4/2018 | Kim et al. |
| 2019/0112527 | A1 | 4/2019 | Moriyama et al. |
| 2019/0319208 | A1 | 10/2019 | Han et al. |
| 2021/0183999 | A1 | 6/2021 | Kwon et al. |

FOREIGN PATENT DOCUMENTS

| | | |
|---|---|---|
| KR | 20120056024 A | 6/2012 |
| KR | 20150034621 A | 4/2015 |
| KR | 101517094 B1 | 6/2015 |
| KR | 20160135874 A | 11/2016 |
| KR | 20180077086 A | 7/2018 |
| KR | 20190100885 A | 8/2019 |
| KR | 20190106823 A | 9/2019 |
| KR | 20190119433 A | 10/2019 |
| KR | 20200112724 A | 10/2020 |
| KR | 102252445 B1 | 5/2021 |
| WO | 2017188300 A1 | 11/2017 |

OTHER PUBLICATIONS

Eun-Pyo Jang et al., "Synthesis of Alloyed ZnSeTe Quantum Dots as Bright, Color-Pure Blue Emitters," ACS Appl. Mater. Interfaces, Nov. 20, 2019, pp. 46062-46069, vol. 11.

Hiroshi Asano et al., "Colloidal Zn(Te,Se)/ZnS Core/Shell Quantum Dots Exhibiting Narrow-Band and Green Photoluminescence," ACS Omega, Jun. 20, 2018, pp. 6703-6709, vol. 3.

Office Action dated Nov. 20, 2024 of the corresponding Korean Patent Application No. 10-2020-0134708.

Notice of Allowance dated Jun. 1, 2025 of the corresponding Korean Patent Application No. 10-2020-0134708.

* cited by examiner

Pattern Preparation by using a photoresist

Repeating the Patterning Process three times

QUANTUM DOT, PRODUCTION METHOD THEREOF, AND ELECTRONIC DEVICE INCLUDING THE SAME

CROSS-REFERENCE TO RELATED APPLICATION

This application claims priority to and the benefit of Korean Patent Application No. 10-2020-0134708, filed in the Korean Intellectual Property Office on Oct. 16, 2020, and all the benefits accruing therefrom under 35 U.S.C. § 119, the content of which in its entirety is incorporated herein by reference.

BACKGROUND

1. Field

A quantum dot, a production method thereof, and an electronic device including the quantum dot are disclosed.

2. Description of the Related Art

Unlike a bulk material, physical characteristics (e.g., bandgap energies and melting points) of a semiconductor nanoparticle may be controlled by changing the size of the nanoparticle. For example, a semiconductor nanocrystal particle (also known as a quantum dot) is a crystalline material having a size in a range of several nanometers. Because the semiconductor nanocrystal particle has a relatively small size, the nanocrystal particle has a large surface area per a unit volume, and thereby, the particle exhibits a quantum confinement effect and will have different properties than bulk materials of the same chemical composition. A quantum dot may absorb energy from an excitation source, e.g., light or an applied electric current, and upon relaxation to the ground state the quantum dot emits light energy corresponding to a bandgap energy of the quantum dot.

SUMMARY

An embodiment provides an environmentally friendly quantum dot capable of realizing improved optical properties (e.g., a luminous efficiency).

An embodiment provides a method of producing the aforementioned quantum dot.

An embodiment provides an electronic device, e.g., a display device, including the aforementioned quantum dot.

In an embodiment, a quantum dot (or quantum dots, hereinafter referred to as "quantum dot") has a core-shell structure including a core including a first semiconductor nanocrystal including zinc, tellurium, and selenium, and a semiconductor nanocrystal shell disposed on the core, the semiconductor nanocrystal shell including a Group II-VI compound, wherein the quantum dot further includes phosphorus and fluorine, and the quantum dot does not include cadmium.

The quantum dot is configured to emit green light.

A maximum luminescent (e.g., photoluminescent) peak wavelength of the green light or the quantum dot may be in a range of greater than or equal to about 480 nanometers (nm) and less than or equal to about 580 nm. The maximum luminescent wavelength may be greater than or equal to about 490 nm, greater than or equal to about 500 nm, greater than or equal to about 510 nm, or greater than or equal to about 520 nm. The maximum luminescent wavelength may be less than or equal to about 560 nm, less than or equal to about 550 nm, or less than or equal to about 540 nm.

The quantum dot may not include lead, mercury, or a combination thereof.

The first semiconductor nanocrystal or the core may include a first zinc chalcogenide including zinc, tellurium, and selenium.

The Group II-VI compound may include a second zinc chalcogenide. The second zinc chalcogenide includes zinc; and a chalcogen element (e.g., selenium, sulfur, tellurium, or a combination thereof).

In the quantum dot, a mole ratio of tellurium with respect to selenium (Te:Se) may be greater than or equal to about 0.1:1. In the quantum dot, a mole ratio of tellurium with respect to selenium (Te:Se) may be greater than or equal to about 0.45:1, greater than or equal to about 0.5:1, or greater than or equal to about 0.8:1.

In the quantum dot, a mole ratio of tellurium with respect to selenium (Te:Se) may be greater than or equal to about 0.95:1, greater than or equal to about 1:1, greater than or equal to about 1.2:1, greater than or equal to about 1.3:1, greater than or equal to about 1.4:1, or greater than or equal to about 1.5:1. In the quantum dot, a mole ratio of tellurium with respect to selenium (Te:Se) may be greater than or equal to about 2:1, or greater than or equal to about 2.1:1.

In the quantum dot, a mole ratio of tellurium with respect to selenium (Te:Se) may be less than or equal to about 4:1, less than or equal to about 3:1, or less than or equal to about 2.5:1.

In an embodiment, the quantum dot(s) or the core may not include a Group III-V compound.

The quantum dot(s) may be water-insoluble.

The first semiconductor nanocrystal or the core may include $ZnTe_xSe_{1-x}$, wherein x is greater than or equal to about 0.4, greater than or equal to about 0.45, or greater than or equal to about 0.5, and less than or equal to about 0.95, or less than or equal to about 0.9.

In the core, a mole ratio of tellurium with respect to selenium (Te:Se) may be greater than or equal to about 0.2:1, greater than or equal to about 0.5:1, greater than or equal to about 1:1, greater than or equal to about 1.5:1, or greater than or equal to about 2:1. In the core, a mole ratio of tellurium with respect to selenium (Te:Se) may be less than or equal to about 5:1, less than or equal to about 4:1, less than or equal to about 3:1, less than or equal to about 2.5:1, or less than or equal to about 2.

The quantum dot (or the semiconductor nanocrystal shell) may include selenium and sulfur.

In the quantum dot, a mole ratio of sulfur with respect to selenium (S:Se) may be greater than 0:1, greater than or equal to about 0.01:1, or greater than or equal to about 0.02:1. In the quantum dot, a mole ratio of sulfur with respect to selenium (S:Se) may be less than or equal to about 4:1, less than or equal to about 3.5:1, less than or equal to about 3:1, less than or equal to about 2.5:1, less than or equal to about 2:1, less than or equal to about 1.5:1, less than or equal to about 1:1, or less than or equal to about 0.9.

In the quantum dot, a mole ratio of phosphorus with respect to tellurium (P:Te) may be greater than or equal to about 0.1:1.

In the quantum dot, a mole ratio of phosphorus with respect to tellurium (P:Te) may be less than or equal to about 5:1.

In the quantum dot, an amount of fluorine may greater than or equal to about 0.03 atomic percent (at %), greater than or equal to about 0.1 at %, or greater than or equal to about 0.3 at %. In the quantum dot, an amount of fluorine may be less than or equal to about 10 at %. The amount of the fluorine may be measured by an X-ray photoelectron spectroscopy (XPS) analysis.

The quantum dot may further include an alkali metal.

The alkali metal may include lithium, sodium, potassium, cesium, rubidium, or a combination thereof.

In the quantum dot, a mole ratio of an alkali earth metal with respect to tellurium may be greater than or equal to about 0.01:1, or greater than or equal to about 0.05:1.

In the quantum dot, a mole ratio of an alkali earth metal with respect to tellurium may be less than or equal to about 10:1, less than or equal to about 8:1, less than or equal to about 7:1, or less than or equal to about 6:1.

The quantum dot may further include aluminum.

In the quantum dot, a mole ratio of aluminum with respect to tellurium (Al/Te) may be greater than or equal to about 0.005:1, less than or equal to about 0.5:1, or a combination thereof.

A maximum luminescent peak of the quantum dot may have a full width at half maximum of less than or equal to about 45 nm.

A quantum efficiency (or a quantum yield) of the quantum dot may be greater than or equal to about 60%, greater than or equal to about 70%, or greater than or equal to about 80%.

The quantum dot may include an organic ligand e.g., on a surface thereof. The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, $R_2POOH$, a polymeric organic ligand, or a combination thereof wherein R and R' are the same or different, and are independently a substituted or unsubstituted C1 to C40 aliphatic hydrocarbon group or a substituted or unsubstituted C6 to C40 aromatic hydrocarbon group, or a combination thereof.

In an embodiment, a method of manufacturing the quantum dot(s) includes:

preparing the core; and reacting a Group II metal precursor and a chalcogen element precursor in the presence of the core and a first organic ligand in a first organic solvent to form the semiconductor nanocrystal shell on the core;

wherein the reaction is carried out in the presence of an additive including phosphorus and fluorine.

The additive may further include an alkali metal.

The additive may include a compound represented by the following chemical formula:

wherein M is lithium, sodium, potassium, cesium, rubidium, or a combination thereof.

In an embodiment, the preparing of the core may include preparing a zinc precursor organic solution including a zinc precursor and a second organic ligand in a second organic solvent; and while heating the zinc precursor organic solution at a core formation temperature, adding thereto a selenium precursor, a tellurium precursor, a hydride compound, and a third organic ligand different from the second organic ligand.

In an embodiment, a quantum dot (e.g., polymer) composite includes a (e.g., polymer) matrix; and a plurality of quantum dots dispersed in the (polymer) matrix, wherein the plurality of quantum dots includes the aforementioned quantum dot(s).

The matrix may include a polymer.

The matrix may include a cross-linked polymer, a monomer or a polymer including a carboxylic acid group, or a combination thereof.

The cross-linked polymer may include a polymerization product of a photopolymerizable monomer including a carbon-carbon double bond, a polymerization product of the photopolymerizable monomer and a multiple thiol compound having at least two thiol groups (e.g., at a terminal end of the multiple thiol compound), or a combination thereof.

The quantum dot composite may further include a metal oxide fine particle (e.g., dispersed in the polymer matrix).

In an embodiment, a display device includes a light emitting element, and the light emitting element includes a plurality of the core-shell quantum dot(s).

In an embodiment, a display device includes a light emitting element (e.g., a photoluminescent element) and optionally a light source, wherein the light emitting element includes the quantum dot(s) or the quantum dot-polymer composite. If present, the light source may be configured to provide the light emitting element with incident light.

The incident light may have a photoluminescence peak wavelength of about 440 nm to about 560 nm (e.g., from about 440 nm to about 460 nm or from about 455 nm to about 460 nm).

The light emitting element may include a sheet of the quantum dot polymer composite.

The light emitting element may include a stacked structure including a substrate and a light emitting layer (e.g., a photoluminescent layer) disposed on the substrate. The light emitting layer may include a pattern of the quantum dot polymer composite. The pattern may include a, e.g., at least one or two, repeating section configured to emit light at a predetermined wavelength.

The display device may be configured to have color reproducibility of greater than or equal to about 80% under a BT2020 standard.

In an embodiment, an electronic device may include a first electrode and a second electrode each having a surface opposite the other; and an active layer including the quantum dot, e.g., disposed between the first and the second electrodes.

The electronic device may further include a charge auxiliary layer (e.g., a hole auxiliary layer) disposed between the first electrode and the active layer.

The electronic device may further include a charge auxiliary layer (e.g., an electron auxiliary layer) disposed between the first electrode and the active layer.

In an embodiment, a quantum dot may show improved optical properties (e.g., a narrowed full width at half maximum together with an enhanced luminous efficiency) at a desired wavelength (of greater than about 470 nm or a green light region), while it may not include a harmful heavy metal such as cadmium.

According to an embodiment, in the formation of a semiconductor nanocrystal shell on a ternary component core not including a harmful heavy metal, an interface property may be improved and thus the coating of a semiconductor nanocrystal shell including a zinc chalcogenide may significantly improve the luminous efficiency of the quantum dot.

According to an embodiment, the quantum dot may emit green light with a relatively high quantum efficiency and a relatively narrow full width at half maximum (FWHM) and thus it may be included in a variety of forms (for example, as a film, a pattern, a rail, or a combination thereof) in a quantum dot based light emitting device or a display device including the same, contributing to realization of a display having high color reproducibility, a high efficiency, and a high brightness.

The quantum dot of an embodiment may also be applied to, e.g., used in, a bio-labeling (biosensor, bio-imaging), a security ink, a photodetector, a solar cell, a hybrid composite, or the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1A:
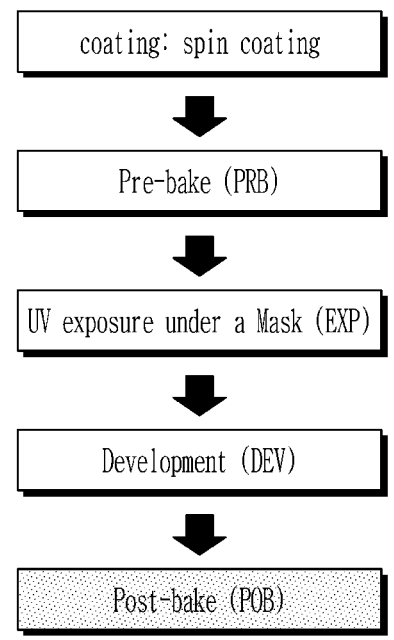
FIG. 1A schematically represents a process of producing a quantum dot composite pattern using a composition according to an embodiment.
Figure 1A:
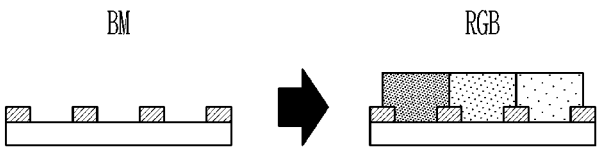

Advantages and characteristics of this disclosure, and a method for achieving the same, will become evident referring to the following example embodiments together with the drawings attached hereto. However, the embodiments should not be construed as being limited to the embodiments set forth herein. Rather, these embodiments are provided so that this disclosure will be thorough and complete, and will fully convey the scope of the invention to those skilled in the art.

Unless otherwise defined, all terms used in the specification (including technical and scientific terms) may be used with meanings commonly understood by a person having ordinary knowledge in the art. It will be further understood that terms, such as those defined in commonly dictionary should be interpreted as having a meaning that is consistent with their meaning in the context of the relevant art, and may not be interpreted ideally or exaggeratedly unless clearly defined. The terminology used herein is for the purpose of describing particular embodiments only and is not intended to be limiting.

As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or ±5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" may refer to replacement of hydrogen of a compound or a group by a substituent of a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—$NO_2$), a cyano group (—CN), an amino group (—NRR' wherein R and R' are independently hydrogen or a C1 to C6 alkyl group), an azido group (—$N_3$), an amidino group (—C(=NH)$NH_2$), a hydrazino group (—$NHNH_2$), a hydrazono group (=N($NH_2$)), an aldehyde group (—C(=O)H), a carbamoyl group (—C(O)$NH_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—$SO_3H$) or a salt thereof (—$SO_3M$, wherein M is an organic or inorganic cation), a phosphoric acid group (—$PO_3H_2$) or a salt thereof (—$PO_3MH$ or —$PO_3M_2$, wherein M is an organic or inorganic cation), or a combination thereof.

As used herein, a hydrocarbon group refers to a group including (or consisting of) carbon and hydrogen (e.g., an alkyl, alkenyl, alkynyl, or aryl group). The hydrocarbon group may be a group having a valence of one (or greater) formed by removal of a hydrogen atom (or for example, at least one hydrogen atom) from alkane, alkene, alkyne, or arene. In the hydrocarbon group, a, e.g., at least one, methylene may be replaced by an oxide moiety, a carbonyl moiety, an ester moiety, —NH—, or a combination thereof.

As used herein, "aliphatic" may refers to a saturated or unsaturated linear or branched hydrocarbon group. An aliphatic group may be an alkyl, alkenyl, or alkynyl group, for example.

As used herein, "alkyl" refers to a linear or branched saturated monovalent hydrocarbon group (methyl, ethyl, hexyl, etc.).

As used herein, "alkenyl" refers to a linear or branched monovalent hydrocarbon group having one or more carbon-carbon double bond.

As used herein, "alkynyl" refers to a linear or branched monovalent hydrocarbon group having one or more carbon-carbon triple bond.

As used herein, "aromatic" refers to an organic compound or group comprising a, e.g., at least one, unsaturated cyclic group having delocalized pi electrons. The term encompasses both hydrocarbon aromatic compounds and heteroaromatic compounds.

As used herein, "aryl" refers to a group formed by removal of a, e.g., at least one, hydrogen from an aromatic hydrocarbon (e.g., a phenyl or naphthyl group).

As used herein, "hetero" refers to one including one or more (e.g., 1 to 3) heteroatom of N, O, S, Si, P, or a combination thereof.

As used herein, "(meth)acryl" refers to acryl, methacryl, or a combination thereof (e.g., an acrylate or methacrylate).

As used herein, the wording "Group" refers to a group of Periodic Table.

As used herein, "Group II" refers to a Group IIA and a Group IIB, and examples of Group II metal may be Zn, Hg, and Mg, but are not limited thereto.

As used herein, "Group III" may refer to Group IIIA and Group IIIB, and examples of Group III metal may be In, Ga, Tl, or a combination thereof, but are not limited thereto.

As used herein, "Group V" may include nitrogen, phosphorus, arsenic, antimony, bismuth, or a combination thereof but is not limited thereto.

As used herein, "Group VI" may include sulfur, selenium, tellurium, or a combination thereof, but is not limited thereto.

The term "average" used in this disclosure (e.g., an average size of the quantum dot) may be a mean or a median. In an embodiment, the average may be a "mean" average.

As used herein, a quantum efficiency (also referred to as a quantum yield) may be a ratio of emitted photons therefrom with respect to the absorbed photons by the quantum dot(s). In an embodiment, the quantum efficiency may be determined by any suitable method. For example, quantum efficiency may be measured by an absolute method and a relative method. The quantum efficiency may be determined by a comparison method using a well characterized standard sample of a known quantum yield or by an absolute method using an integrating sphere with commercially available equipment. The quantum efficiency may be a relative quantum yield or an absolute quantum yield. The quantum efficiency (or quantum yield) may be measured in a solution state or a solid state (as in a composite).

In the absolute method, the quantum yield may be determined by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on the photoluminescent wavelengths, but are not limited thereto.

The quantum yield (QY) may be readily and reproducibly determined by using commercially available equipment, for example, from Hitachi Co. Ltd or Hamamatsu Co. Ltd and referring to the instruction manuals provided from the manufacturer.

The FWHM and the maximum luminescent peak wavelength may be determined by a (photo)luminescent spectrum obtained by a spectrophotometer (or Fluorescence Spectrophotometer).

As used herein, the expression "not including cadmium (or other harmful heavy metal)" may refer to the case in which a concentration of each of cadmium (or another heavy metal deemed harmful) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other heavy metal) may be present or, if present, an amount of cadmium (or other heavy metal) may be less than or equal to a detection limit or as an impurity level of a given analysis tool (e.g., an inductively coupled plasma atomic emission spectroscopy).

Semiconductor nanoparticles (e.g., a quantum dots) may absorb energy or light from an excitation source (for example, a light source providing incident light or electrodes facing each other) and may emit light corresponding to a bandgap energy of the quantum dots. The bandgap energy of the quantum dot may vary with the size, the composition, or a combination thereof of the quantum dot. Semiconductor nanocrystals may be used as a light emitting material in various fields such as a display device, an energy device, or a bio light emitting device.

Quantum dots having relatively increased photoluminescence properties may include a toxic heavy metal such as cadmium (Cd), lead (Pb), mercury (Hg), or a combination thereof. A toxic heavy metal such as cadmium may cause environmental issues, health issues, or a combination thereof and is one of the restricted elements under Restriction of Hazardous Substances Directive (RoHS) in many countries. Accordingly, development of an environmentally friendly quantum dot having improved luminescence characteristics (as being applied to a light emitting device such as an electro- or photoluminescent device) at a desired wavelength may be desired. An indium phosphide based quantum dot may be applied, e.g., used, in an actual device.

In order to be applied to, e.g., used in, a quantum dot display device (e.g., including a color conversion layer including the quantum dot) and to realize a display device having a relatively high color reproducibility under a next generation color standard such as BT2020, a quantum dot having a relatively narrow full width at half maximum (FWHM) may be desirable. For example, in order for a device to achieve an enhanced, e.g., improved, color reproducibility under the BT2020 standard, a luminous material used therein may be desired to have a reduced level of a FWHM, e.g., a narrower FWHM. However, in comparison with a Cd based core (e.g., a CdSe core), a Group III-V compound based quantum dot including indium and phosphorus has a smaller bandgap and a larger Bohr radius and changes in the FWHM depending on a size of the quantum dot may be significant. Accordingly, the InP based quantum dot may not have a reduced level of a FWHM, e.g., a narrower FWHM, while emitting light of a desired wavelength (e.g., greater than about 470 nm, greater than or equal to about 475 nm, greater than or equal to about 480 nm, and less than or equal to about 580 nm). In addition, the core including indium and phosphorus may be susceptible to surface oxidation and a quantum dot including the same may have an increased FWHM when including a shell, e.g., a shell is coated on a core of the quantum dot, and it may be difficult to achieve a quantum efficiency of a desired level together with a desired FWHM.

In the case of a zinc selenide based nanocrystal particle including tellurium as a cadmium free quantum dot, a wavelength difference caused by a particle distribution may be maintained at a desired low level, in comparison with an indium phosphide quantum dot or a cadmium based quantum dot. In other words, even if a change in a particle size distribution were relatively significant, a change in a luminescent wavelength may not really noticeable, which may be beneficial for a resulting quantum dot to show, e.g., exhibit, a reduced level of a FWHM, e.g., a narrower FWHM.

However, a quantum dot structure including a ZnTeSe based core and an inorganic shell coated thereon may not exhibit a desired dispersing property (e.g., an organic solvent dispersity) and may not show, e.g., exhibit, a desired luminous property. Without wishing to be bound any theory, it is believed that a bandgap offset between the core and the shell in a ZnSe core including tellurium and a zinc chalcogenide shell is not sufficiently large, and thus even a physically well-formed shell layer may not result in a quantum yield that is sufficiently and desirably high. The present inventors have found that a greater amount of tellurium in the core may have a seriously adverse effect on the core stability (e.g., a stability against oxidation). Accordingly, a quantum dot having zinc selenide core including tellurium may not exhibit optical properties desired for a display device.

In an embodiment, a quantum dot including a zinc selenide together tellurium may have the features described herein, and be capable of exhibiting significantly improved optical properties.

In an embodiment, the quantum dot may not include a harmful heavy metal such as cadmium, lead, or mercury and may emit light of a desired wavelength (e.g., green light) with improved optical properties.

In an embodiment, a quantum dot(s) (hereinafter, referred to as "quantum dot") includes (include) zinc, selenium, and tellurium. The quantum dot(s) has (have) a core shell structure. The core shell structure includes a core including a first semiconductor nanocrystal material; and a semiconductor nanocrystal shell disposed on the core (or a surface thereof) and including a Group II-VI compound (e.g., a zinc chalcogenide). The quantum dot may include phosphorus (P) and fluorine (F).

The quantum dot (or a core thereof) may include tellurium of a predetermined amount. In an embodiment, the first semiconductor nanocrystal or the core may include a first zinc chalcogenide including tellurium. An amount of components included in the quantum dot as described herein may be determined through an appropriate analysis tool (e.g., an inductively coupled plasma atomic emission spectroscopy (ICP-AES), an X-ray photoelectron spectroscopy (XPS), an ion chromatography, a Transmission electron microscopy energy-dispersive X-ray spectroscopy (TEM-EDS), or the like).

The core may include a crystal of a first zinc chalcogenide (e.g., a zinc compound including a selenium and tellurium in a form of an alloy or a doped form. In the core or in the quantum dot, an amount of the tellurium may be greater than an amount of the selenium. In the semiconductor nanocrystal shell, the Group II-VI compound may include a second zinc chalcogenide that is (or has a composition) different from the core or the first zinc chalcogenide. The second zinc chalcogenide may include zinc; and selenium, sulfur, tellurium, or a combination thereof.

In the quantum dot of an embodiment, a first semiconductor nanocrystal included in the core may include $ZnTe_xSe_{1-x}$ (wherein x is greater than 0.1, greater than or equal to about 0.2, greater than or equal to about 0.3, greater than or equal to about 0.4, greater than or equal to about 0.5, greater than or equal to about 0.51, greater than or equal to about 0.52, greater than or equal to about 0.53, greater than or equal to about 0.54, greater than or equal to about 0.55, greater than or equal to about 0.56, greater than or equal to about 0.57, greater than or equal to about 0.58, greater than or equal to about 0.59, greater than or equal to about 0.6, greater than or equal to about 0.61, greater than or equal to about 0.62, greater than or equal to about 0.63, greater than or equal to about 0.64, greater than or equal to about 0.65, greater than or equal to about 0.66, greater than or equal to about 0.67, greater than or equal to about 0.68, greater than or equal to about 0.69, greater than or equal to about 0.70, greater than or equal to about 0.71, greater than or equal to about 0.72, greater than or equal to about 0.73, greater than or equal to about 0.74, greater than or equal to about 0.75, or greater than or equal to about 0.8 and less than or equal to about 0.9, less than or equal to about 0.89, less than or equal to about 0.88, less than or equal to about 0.87, less than or equal to about 0.86, less than or equal to about 0.85, less than or equal to about 0.84, less than or equal to about 0.83, less than or equal to about 0.82, less than or equal to about 0.8, less than or equal to about 0.75, less than or equal to about 0.7, less than or equal to about 0.65, less than or equal to about 0.6, less than or equal to about 0.5, less than or equal to about 0.4, less than or equal to about 0.3, or less than or equal to about 0.2).

In a quantum dot of an embodiment, a mole ratio of tellurium with respect to selenium (Te:Se) may be greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, greater than or equal to about 0.45:1, greater than or equal to about 0.5:1, greater than or equal to about 0.55:1, greater than or equal to about 0.6:1, greater than or equal to about 0.65:1, greater than or equal to about 0.7:1, greater than or equal to about 0.75:1, greater than or equal to about 0.8:1, greater than or equal to about 0.85:1, greater than or equal to about 0.9:1, greater than or equal to about 0.93:1, greater than or equal to about 0.95:1, greater than or equal to about 1:1, greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.1:1, greater than or equal to about 2.2:1, greater than or equal to about 2.3:1, greater than or equal to about 2.4:1, greater than or equal to about 2.5:1, greater than or equal to about 2.6:1, greater than or equal to about 2.7:1, greater than or equal to about 2.8:1, greater than or equal to about 2.9:1, or greater than or equal to about 3:1.

In a quantum dot of an embodiment, a mole ratio of tellurium with respect to selenium (Te:Se) may be less than or equal to about 4:1, less than or equal to about 3.9:1, less than or equal to about 3.8:1, less than or equal to about 3.7:1, less than or equal to about 3.6:1, less than or equal to about 3.5:1, less than or equal to about 3.4:1, less than or equal to about 3.3:1, less than or equal to about 3.2:1, less than or equal to about 3.1:1, less than or equal to about 3:1, less than or equal to about 2.9:1, less than or equal to about 2.8:1, less than or equal to about 2.7:1, less than or equal to about 2.6:1, less than or equal to about 2.5:1, less than or equal to about 2.4:1, less than or equal to about 2.3:1, less than or equal to about 2.2:1, less than or equal to about 2.1:1, less than or equal to about 2.0:1, less than or equal to about 1.9:1, less than or equal to about 1.8:1, less than or equal to about 1.7:1, less than or equal to about 1.6:1, less than or equal to about 1.5:1, less than or equal to about 1.4:1, less than or equal to about 1.3:1, less than or equal to about 1.2:1, less than or equal to about 1.1:1, less than or equal to about 1:1, or less than or equal to about 0.9:1.

In the quantum dot of an embodiment or in the core (or the first semiconductor nanocrystal), a mole ratio of selenium with respect to tellurium (Se:Te) may be less than or equal to about 7:1, less than or equal to about 6.5:1, less than or equal to about 6:1, less than or equal to about 5.5:1, less than or equal to about 5:1, less than or equal to about 4.5:1, less than or equal to about 4:1, less than or equal to about 3.5:1, less than or equal to about 3:1, less than or equal to about 2.5:1, less than or equal to about 2:1, less than or equal to about 1.5:1, less than or equal to about 1:1, less than or equal to about 0.9:1, less than or equal to about 0.8:1, less than or equal to about 0.7:1, less than or equal to about 0.6:1, less than or equal to about 0.5:1, or less than or equal to about 0.45:1.

In the quantum dot of an embodiment or in the core (or the first semiconductor nanocrystal), a mole ratio of selenium with respect to tellurium (Se:Te) may be greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, greater than or equal to about 0.5:1, greater than or equal to about 0.55:1, greater than or equal to about 0.6:1, greater than or equal to about 0.65:1, greater than or equal to about 0.7:1, greater than or equal to about 0.75:1, greater than or equal to about 0.8:1, greater than or equal to about 0.85:1, greater than or equal to about 0.9:1, greater than or equal to about 0.95:1, greater than or equal to about 1:1, greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.5:1, greater than or equal to about 3:1, greater than or equal to about 3.5:1, greater than or equal to about 4:1, greater than or equal to about 4.5:1, greater than or equal to about 5:1, or greater than or equal to about 5.5:1.

In a quantum dot of an embodiment, a mole ratio of tellurium with respect to zinc (Te:Zn) may be greater than 0.03:1, greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, or greater than or equal to about 0.43:1. In a quantum dot of an embodiment, a mole ratio of tellurium with respect to zinc (Te:Zn) (for example may be measured by an inductively coupled plasma atomic emission spectroscopy (ICP-AES)) may be less than about 1:1, less than or equal to about 0.9:1, less than or equal to about 0.8:1, less than or equal to about 0.7:1, less than or equal to about 0.6:1, less than or equal to about 0.5:1, less than or equal to about 0.45:1, less than or equal to about 0.4:1, less than or equal to about 0.35:1, less than or equal to about 0.3:1, less than or equal to about 0.25:1, less than or equal to about 0.2:1, less than or equal to about 0.15:1, or less than or equal to about 0.1:1.

In a quantum dot of an embodiment, a mole ratio of zinc with respect to tellurium (Zn:Te) may be greater than or equal to about 0.5:1, greater than or equal to about 1:1, greater than or equal to about 1.5:1, greater than or equal to about 2:1, greater than or equal to about 2.1:1, greater than or equal to about 2.15:1, greater than or equal to about 2.2:1, greater than or equal to about 3:1, greater than or equal to about 3.5:1, greater than or equal to about 4:1, greater than or equal to about 4.5:1, greater than or equal to about 5:1, or greater than or equal to about 5.5:1. In a quantum dot of an embodiment, a mole ratio of zinc with respect to tellurium (Zn:Te) may be may be less than or equal to about 40:1, less than or equal to about 35:1, less than or equal to about 30:1, less than or equal to about 25:1, less than or equal to about 20:1, less than or equal to about 15:1, less than or equal to about 10:1, less than or equal to about 9:1, less than or equal to about 8.5:1, less than or equal to about 8:1, less than or equal to about 7.5:1, less than or equal to about 7:1, less than or equal to about 6.5:1, less than or equal to about 6:1, less than or equal to about 5.5:1, less than or equal to about 4.5:1, less than or equal to about 4:1, less than or equal to about 3.5:1, less than or equal to about 3:1, less than or equal to about 2.5:1, less than or equal to about 2.4:1, less than or equal to about 2.3:1, or less than or equal to about 2.25:1.

The quantum dot of an embodiment may further include sulfur and if present, a mole ratio of sulfur with respect to zinc may be greater than or equal to about 0.005:1, greater than or equal to about 0.01:1, greater than or equal to about 0.015:1, greater than or equal to about 0.02:1, greater than or equal to about 0.025:1, greater than or equal to about 0.03:1, greater than or equal to about 0.035:1, greater than or equal to about 0.04:1, greater than or equal to about 0.045:1, greater than or equal to about 0.05:1, greater than or equal to about 0.06:1, greater than or equal to about 0.07:1, greater than or equal to about 0.08:1, greater than or equal to about 0.09:1, greater than or equal to about 0.1:1, greater than or equal to about 0.15:1, greater than or equal to about 0.2:1, greater than or equal to about 0.25:1, greater than or equal to about 0.3:1, or greater than or equal to about 0.35 and less than or equal to about 0.95:1, less than or equal to about 0.9:1, less than or equal to about 0.85:1, less than or equal to about 0.8:1, less than or equal to about 0.75:1, less than or equal to about 0.7:1, less than or equal to about 0.65:1, less than or equal to about 0.6:1, less than or equal to about 0.5:1, less than or equal to about 0.4:1, or less than or equal to about 0.3:1.

In a core-shell quantum dot of an embodiment, a mole ratio of sulfur with respect to tellurium (S:Te) may be greater than 0, greater than or equal to about 0.01:1, greater than or equal to about 0.05:1, greater than or equal to about 0.1:1, greater than or equal to about 0.2:1, greater than or equal to about 0.3:1, greater than or equal to about 0.4:1, or greater than or equal to about 0.5 and less than or equal to about 8:1, less than or equal to about 7:1, less than or equal to about 6:1, less than or equal to about 5:1, less than or equal to about 4.5:1, less than or equal to about 4:1, less than or equal to about 3.5:1, less than or equal to about 3:1, less than or equal to about 2.5:1, less than or equal to about 2:1, less than or equal to about 1.5:1, less than or equal to about 1:1, less than or equal to about 0.9:1, less than or equal to about 0.8:1, less than or equal to about 0.7:1, less than or equal to about 0.6:1, less than or equal to about 0.5:1, or less than or equal to about 0.4:1.

In the quantum dot of an embodiment, a mole ratio of a sum of sulfur and selenium to tellurium ((Se+S):Te) may be greater than or equal to about 2:1, greater than or equal to about 3:1, greater than or equal to about 4:1, greater than or equal to about 5:1, greater than or equal to about 6:1, greater than or equal to about 7:1, greater than or equal to about 8:1, greater than or equal to about 9:1, or greater than or equal to about 10:1. In the quantum dot of an embodiment, a mole ratio of a sum of sulfur and selenium to tellurium ((Se+S):Te) may be less than or equal to about 16:1, less than or equal to about 15:1, less than or equal to about 14:1, less than or equal to about 13:1, less than or equal to about 12:1, less than or equal to about 11:1, less than or equal to about 10:1, less than or equal to about 9:1, less than or equal to about 8:1, less than or equal to about 7:1, less than or equal to about 6:1, less than or equal to about 5:1, less than or equal to about 4:1, less than or equal to about 3:1, or less than or equal to about 2:1.

In an embodiment, the quantum dot may not include manganese, copper, or a combination thereof, for example in the core or in the shell. In an embodiment, the quantum dot may not include a Group III-V compound. The Group III-V compound may include an indium phosphide, an indium zinc phosphide, a gallium phosphide, or a combination thereof. The core-shell quantum dot may not exhibit a peak assigned to the Group III-V compound (e.g., an indium phosphide or a gallium phosphide) in an X-ray diffraction analysis.

In an embodiment, the quantum dot includes phosphorus and fluorine (for example, in the core, in an interface between the core and the semiconductor nanocrystal shell, in the shell, or a combination thereof). In an embodiment, the phosphorus and the fluorine may be introduced into the quantum dot during formation of the shell on the core in the presence of an additive including phosphorus and fluorine in the preparation process of the quantum dot that will be described herein. Without wishing to be bound by any theory, in a reaction system for forming the shell, the additive may be decomposed in a variety of paths, e.g., by a variety of pathways, during the shell formation, promoting a reaction for the shell formation (for example, by increasing a shell formation reaction rate), reacting a surface of the core (for example, via a ligand exchange) to induce a surface modification and contributing to a quantum dot shape control together with a facet, e.g., surface, engineering, or a combination thereof. Without wishing to be bound by any theory, in an embodiment, using the additive as set forth herein may cause a surface modification of the core to occur together with a formation of the semiconductor nanocrystal shell including a Group II-VI compound, and thus, a quantum dot of an embodiment may exhibit improved (e.g., maximized) a quantum efficiency (e.g., a relative or an absolute quantum yield).

Without wishing to be bound by any theory, the preparation process of an embodiment may make it possible for the semiconductor nanocrystal shell to grow in the form of substantially entirely surrounding the core, and thus the shell may provide the core a relatively uniform coating with a desired thickness, and the energy band distribution of the uniformly coated shell may be more effective in the confinement of the electron by the shell layer, achieving remarkably increased quantum efficiency or photoluminescent quantum yield (PLQY, %).

Using the core with an increased amount of the tellurium may cause an increase of an oxide amount during the shell formation reaction. However, forming the shell in the presence of the additive in an embodiment may reduce or prevent the deterioration (e.g., oxidation) of the core, and the fluorine and the phosphorus may be disposed on the quantum dot during a growth thereof and provide a growing facet, e.g., site or surface, more favorable to shell growth. Accordingly, in an embodiment, the quantum dot of a core-shell may show a relatively narrow full width at half maximum.

In a quantum dot of an embodiment, an amount of phosphorus may be, per one mole of tellurium, greater than or equal to about 0.05 moles, greater than or equal to about 0.1 moles, greater than or equal to about 0.15 moles, greater than or equal to about 0.2 moles, greater than or equal to about 0.25 moles, greater than or equal to about 0.3 moles, greater than or equal to about 0.35 moles, greater than or equal to about 0.4 moles, greater than or equal to about 0.45 moles, greater than or equal to about 0.5 moles, greater than or equal to about 0.55 moles, greater than or equal to about 0.6 moles, greater than or equal to about 0.65 moles, greater than or equal to about 0.7 moles, greater than or equal to about 0.75 moles, greater than or equal to about 0.8 moles, greater than or equal to about 0.85 moles, greater than or equal to about 0.9 moles, greater than or equal to about 0.95 moles, greater than or equal to about 1 mole, greater than or equal to about 1.1 moles, greater than or equal to about 1.2 moles, greater than or equal to about 1.3 moles, greater than or equal to about 1.4 moles, greater than or equal to about 1.4 moles, greater than or equal to about 1.5 moles, greater than or equal to about 1.6 moles, greater than or equal to about 1.7 moles, greater than or equal to about 1.8 moles, greater than or equal to about 1.9 moles, or greater than or equal to about 2 moles.

In a quantum dot of an embodiment, an amount of phosphorus may be, per one mole of tellurium, less than or equal to about 5 moles, less than or equal to about 4.5 moles, less than or equal to about 4 moles, less than or equal to about 3.9 moles, less than or equal to about 3.8 moles, less than or equal to about 3.7 moles, less than or equal to about 3.6 moles, less than or equal to about 3.5 moles, less than or equal to about 3 moles, less than or equal to about 2.5 moles, or less than or equal to about 2 moles.

In a quantum dot of an embodiment, an amount of fluorine may be greater than or equal to about 0.03 at %, greater than or equal to about 0.1 at %, greater than or equal to about 0.15 at %, greater than or equal to about 0.2 at %, greater than or equal to about 0.25 at %, greater than or equal to about 0.3 at %, greater than or equal to about 0.4 at %, greater than or equal to about 0.5 at %, greater than or equal to about 0.6 at %, greater than or equal to about 0.7 at %, greater than or equal to about 0.8 at %, greater than or equal to about 0.9 at %, greater than or equal to about 1 at %, greater than or equal to about 1.5 at %, greater than or equal to about 2 at %, greater than or equal to about 2.5 at %, or greater than or equal to about 3 at %.

In a quantum dot of an embodiment, an amount of fluorine may be less than or equal to about 10 at %, less than or equal to about 9.5 at %, less than or equal to about 9 at %, less than or equal to about 8.5 at %, less than or equal to about 8 at %, less than or equal to about 7.5 at %, less than or equal to about 7 at %, less than or equal to about 6.5 at %, less than or equal to about 6 at %, less than or equal to about 5.5 at %, less than or equal to about 5 at %, less than or equal to about 4.5 at %, less than or equal to about 4 at %, or less than or equal to about 3.5 at %.

The amount of the fluorine may be measured by using an X-ray photoelectron spectroscopy (XPS).

The additive may further include an alkali metal, and thus the quantum dot may further include an alkali metal. The alkali metal may include lithium, sodium, potassium, cesium, rubidium, or a combination thereof. The alkali metal may include lithium. In the quantum dot, an amount of the alkali metal may be, per one mole of tellurium, greater than or equal to about 0.01 moles, greater than or equal to about 0.05 moles, greater than or equal to about 0.1 moles, greater than or equal to about 0.2 moles, greater than or equal to about 0.3 moles, greater than or equal to about 0.4 moles, greater than or equal to about 0.5 moles, greater than or equal to about 0.6 moles, greater than or equal to about 0.7 moles, greater than or equal to about 0.8 moles, greater than or equal to about 0.9 moles, or greater than or equal to about 1 mole. In the quantum dot, an amount of the alkali metal may be, per one mole of tellurium, less than or equal to about 10 moles, less than or equal to about 9.5 moles, less than or equal to about 9 moles, less than or equal to about 8.5 moles, less than or equal to about 8 moles, less than or equal to about 7.5 moles, less than or equal to about 7 moles, less than or equal to about 6.5 moles, less than or equal to about 6 moles, less than or equal to about 5.5 moles, less than or equal to about 5 moles, less than or equal to about 4.5 moles, less than or equal to about 4 moles, less than or equal to about 3.5 moles, less than or equal to about 3 moles, less than or equal to about 2.5 moles, less than or equal to about 2 moles, or less than or equal to about 1.5 moles, or less than or equal to about 1 mole.

The quantum dot of an embodiment may further include aluminum. In the quantum dot, a mole ratio of aluminum with respect to tellurium (Al:Te) may be greater than or equal to about 0.005:1, greater than or equal to about 0.01:1, greater than or equal to about 0.05:1, greater than or equal to about 0.1:1, greater than or equal to about 0.2:1, greater than or equal to about 0.3:1, greater than or equal to about 0.4:1, or greater than or equal to about 0.50:1. In the quantum dot, a mole ratio of aluminum with respect to tellurium (Al:Te) may be less than or equal to about 1.5:1, less than or equal to about 1:1, less than or equal to about 0.9:1, less than or equal to about 0.85:1, less than or equal to about 0.8:1, less than or equal to about 0.75:1, less than or equal to about 0.7:1, less than or equal to about 0.65:1, less than or equal to about 0.6:1, or less than or equal to about 0.55:1.

In an embodiment, an amount of the aluminum may be determined by an X-ray photoelectron spectroscopy analysis. In an embodiment, the amount of the aluminum in the quantum dot may be greater than or equal to about 0.05 at %, greater than or equal to about 0.1 at %, or greater than or equal to about 0.5 at %, and less than or equal to about 5 at %, less than or equal to about 4 at %, less than or equal to about 3 at %, less than or equal to about 2 at %, or less than or equal to about 1.5 at %, based on a total amount of elements of the quantum dot.

The shell may be a multi-layered shell including a plurality of layers. In the plurality of layers for the shell, adjacent layers may have semiconductor nanocrystal material of different compositions. The multi-layered shell may include a first shell layer disposed on (e.g., directly on) the core and a second shell layer disposed on (e.g., directly on) or over the first layer. The first shell layer may include a second semiconductor nanocrystal. The second shell layer may include a third semiconductor nanocrystal having a composition different from the second semiconductor nanocrystal. The second layer may be the outermost layer of the quantum dot.

The first shell layer or the second semiconductor nanocrystal may include zinc, selenium, and optionally sulfur. In an embodiment, the first shell layer or the second semiconductor nanocrystal may not include sulfur. The second shell layer or the third semiconductor nanocrystal may include zinc and sulfur. In an embodiment, the second shell layer or the third semiconductor nanocrystal may not include selenium. In an embodiment, the first shell layer may include ZnSe, ZnSeS, ZnS, or a combination thereof. The second shell layer may consist of ZnS.

In a multi-layered shell, a thickness of each layer may be selected appropriately. The thickness of the shell layer(s) (e.g., the first shell layer, the second shell layer, or a combination thereof) may be each independently greater than or equal to about 1 monolayer (ML), for example, greater than or equal to about 2 ML, greater than or equal to about 3 ML, greater than or equal to about 4 ML, greater than or equal to about 5 ML and less than or equal to about 10 ML, for example, less than or equal to about 9 ML, less than or equal to about 8 ML, less than or equal to about 7 ML, less than or equal to about 6 ML, or less than or equal to about 5 ML. The thickness of each layer in the multi-layered shell may be selected taking into consideration a desired composition of a final quantum dot.

In an embodiment, the shell or each of the shell layers in the multi-layered shell may include a gradient alloy having a composition varying in a direction of a radius, e.g., a radial direction from the core toward an outermost surface of the quantum dot. In an embodiment, an amount of the sulfur in the semiconductor nanocrystal shell may increase toward a surface of the quantum dot. For example, in the shell, the amount of the sulfur may increase in a direction away from the core, e.g., in a radial direction from the core toward an outermost surface of the quantum dot.

In the quantum dot of an embodiment, a size (or an average size) of the core(s) may be greater than or equal to about 1 nm, for example, greater than or equal to about 2 nm, greater than or equal to about 2.5 nm, greater than or equal to about 3 nm, greater than or equal to about 3.5 nm, greater than or equal to about 4 nm, or greater than or equal to about 4.5 nm. A size (or an average size) of the core(s) may be less than or equal to about 7 nm, less than or equal to about 6 nm, less than or equal to about 5 nm, less than or equal to about 4 nm, less than or equal to about 3 nm, or less than or equal to about 2 nm.

The quantum dot(s) (or a population thereof) may have a particle (average) size of greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 7.5 nm, greater than or equal to about 8 nm, greater than or equal to about 8.5 nm, greater than or equal to about 9 nm, greater than or equal to about 9.5 nm, or greater than or equal to about 10 nm. A size (or an average size) of the quantum dot (or a population thereof) may be less than or equal to about 50 nm, for example, less than or equal to about 45 nm, less than or equal to about 40 nm, less than or equal to about 35 nm, less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 11 nm, less than or equal to about 10 nm, less than or equal to about 9 nm, less than or equal to about 8 nm, less than or equal to about 7 nm, less than or equal to about 6 nm, less than or equal to about 5.5 nm, or less than or equal to about 5 nm. In an embodiment, the size of the quantum dot may refer to a diameter or an equivalent diameter obtained from a two-dimensional image of an electron microscopy analysis (e.g., under an assumption of a circle). In an embodiment, "a size" may refer to a size of a single quantum dot or a (e.g., mean or median) average of quantum dots or a population of the quantum dots. A size of the quantum dot(s) may be determined by using a result (e.g., an image) of a (transmission) electron microscopy analysis and any suitable image analysis computer program (e.g., Image J).

The quantum dot(s) may constitute a population of quantum dots. In an embodiment, for example, by the method of an embodiment as described in detail herein, the quantum dots may exhibit a controlled and improved final morphology, and the quantum dot population of an embodiments may exhibit an increased value of an average solidity, an average roundness, or a combination thereof. As used herein, an average may refer to a mean average or a median average. The quantum dot population of an embodiment may have an average roundness of greater than or equal to about 0.70, greater than or equal to about 0.71, greater than or equal to about 0.72, greater than or equal to about 0.73, greater than or equal to about 0.74, greater than or equal to about 0.75, greater than or equal to about 0.76, greater than or equal to about 0.77, greater than or equal to about 0.78, greater than or equal to about 0.79, greater than or equal to about 0.8, or greater than or equal to about 0.81. The quantum dot population of an embodiment may have an average solidity of greater than or equal to about 0.7, greater than or equal to about 0.75, greater than or equal to about 0.8, greater than or equal to about 0.85, or greater than or equal to about 0.9. The quantum dot population may have such controlled shape parameters, which may indicate a uniform shell growth and that the core passivation can be accomplished.

The population of the aforementioned quantum dots may have a standard deviation of sizes that is less than or equal to about 18%, less than or equal to about 17%, less than or equal to about 16%, less than or equal to about 15%, less than or equal to about 14%, less than or equal to about 13%, less than or equal to about 12%, or less than or equal to about 11% of an average size of the quantum dots. The population of the aforementioned quantum dots may have a standard deviation of sizes that is greater than or equal to about 8%, greater than or equal to about 9%, or greater than or equal to about 10%, of an average size of the quantum dots.

In an embodiment, an ultraviolet-visible (UV-Vis) absorption spectrum of the (core or core-shell) quantum dot may include a valley that may be relatively clearly noticed. In a UV-vis absorption spectrum, the quantum dot of an embodiment may have a valley that is adjacent to the first absorption peak or in a range of greater than or equal to about 450 nm (or greater than or equal to about 440 nm, greater than or equal to about 430 nm, or greater than or equal to about 420 nm, or greater than or equal to about 410 nm, or greater than or equal to about 400 nm) up to a wavelength of the first absorption peak.

The quantum dot of an embodiment may exhibit a valley depth of at least a predetermined value. In the UV-vis absorption spectrum of the quantum dot of an embodiment, the valley or the lowest point thereof may be appeared at a wavelength lower, e.g., shorter, than the first absorption peak wavelength. In the UV-vis absorption spectrum of the quantum dot, the intensity of the first absorption peak may be greater than the intensity at the lowest point of the valley adjacent thereto.

Without being bound by any theory, it is believed that in ultraviolet-visible (UV-Vis) absorption spectrum, the presence of the valley or the valley depth may represent a size uniformity of a quantum dot (or a core) or shell coating uniformity of the quantum dot. A noticeable valley depth of a core-shell quantum dot or a core quantum dot may indicate that the (core-shell) quantum dot may have an improved size distribution, an improved coating quality, or a combination thereof, and a narrower FWHM and an increased luminous efficiency may be provided.

In the quantum dot of an embodiment, the valley depth (VD) defined herein may be greater than or equal to about 0.01, for example, greater than or equal to about 0.02, greater than or equal to about 0.03, greater than or equal to about 0.04, greater than or equal to about 0.05, greater than or equal to about 0.06, greater than or equal to about 0.07, greater than or equal to about 0.08, greater than or equal to about 0.09, or greater than or equal to about 0.1:

$$(Abs_{first} - Abs_{valley})/Abs_{first} = VD$$

wherein $Abs_{first}$ is an absorption intensity at a wavelength of the first absorption peak and $Abs_{valley}$ is an absorption intensity at a lowest point of the valley.

The first absorption peak of the quantum dot may be present in a wavelength range of greater than or equal to about 410 nm, for example, greater than or equal to about 420 nm, greater than or equal to about 430 nm, greater than or equal to about 440 nm, greater than or equal to about 450 nm, greater than or equal to about 460 nm, greater than or equal to about 465 nm, greater than or equal to about 470 nm, greater than or equal to about 475 nm, greater than or equal to about 480 nm.

The lowest point of the valley of the quantum dot may be present in a wavelength range of greater than or equal to about 410 nm, for example, greater than or equal to about 420 nm, greater than or equal to about 430 nm, greater than or equal to about 440 nm, greater than or equal to about 450 nm, greater than or equal to about 460 nm, greater than or equal to about 465 nm, greater than or equal to about 470 nm, greater than or equal to about 475 nm, greater than or equal to about 480 nm.

The first absorption peak of the quantum dot may be present in a wavelength range of less than or equal to about 530 nm, less than or equal to about 525 nm, less than or equal to about 520 nm, less than or equal to about 515 nm, less than or equal to about less than or equal to about 510 nm, less than or equal to about 505 nm, less than or equal to about 500 nm, less than or equal to about 495 nm, less than or equal to about 490 nm, less than or equal to about 485 nm, less than or equal to about 480 nm, less than or equal to about 475 nm, less than or equal to about 465 nm, less than or equal to about 460 nm, less than or equal to about 455 nm, less than or equal to about 450 nm, or less than or equal to about 445 nm.

The lowest point of the valley of the quantum dot may be present in a wavelength range of less than or equal to about 530 nm, less than or equal to about 525 nm, less than or equal to about 520 nm, less than or equal to about 515 nm, less than or equal to about less than or equal to about 510 nm, less than or equal to about 505 nm, less than or equal to about 500 nm, less than or equal to about 495 nm, less than or equal to about 490 nm, less than or equal to about 485 nm, less than or equal to about 480 nm, less than or equal to about 475 nm, less than or equal to about 465 nm, less than or equal to about 460 nm, less than or equal to about 455 nm, less than or equal to about 450 nm, less than or equal to about 445 nm.

The quantum dot of an embodiment may emit green light. In an embodiment, the quantum dot may have a maximum (photo)luminescent peak wavelength of greater than or equal to about 480 nm, greater than or equal to about 485 nm, greater than or equal to about 490 nm, greater than or equal to about 495 nm, greater than or equal to about 500 nm, greater than or equal to about 505 nm, greater than or equal to about 510 nm, greater than or equal to about 515 nm, or greater than or equal to about 520 nm. The quantum dot of an embodiment may have a maximum luminescent (e.g., photoluminescent) peak wavelength of less than or equal to about 580 nm, less than or equal to about 570 nm, less than or equal to about 560 nm, less than or equal to about 550 nm, less than or equal to about 540 nm, or less than or equal to about 535 nm. The quantum dot or the green light may have a maximum luminescent peak wavelength of the aforementioned range (for example, from about 500 nm to about 560 nm (e.g., from about 515 nm to about 535 nm).

The quantum dot of an embodiment may exhibit a significantly improved (photoluminescent) quantum efficiency (or quantum yield) (for example, of greater than or equal to about 60%), in comparison with a quantum dot based on zinc, selenium, and tellurium. In an embodiment, the quantum dot(s) may show a quantum efficiency of 60%, greater than or equal to about 65%, greater than or equal to about 70%, greater than or equal to about 75%, or greater than or equal to about 80%. In an embodiment, the quantum efficiency may be less than or equal to about 100%, less than or equal to about 99%, less than or equal to about 98%, less than or equal to about 97%, less than or equal to about 96%, or less than or equal to about 95%.

In an embodiment, the quantum dot may have a shell with an improved coating quality. The quantum dot of an embodiment may exhibit a reduced level of trap emission (that can be determined by a low temperature photoluminescent spectroscopy analysis for example at a temperature of about 77 K). Without being bound by any theory, the reduced level of the trap emission may indicate that the number of defects possibly having an adverse effect on the luminescent properties of the quantum dot may decrease.

In an embodiment, (in a photoluminescent spectroscopy analysis) the quantum dot may have a full width at half maximum (FWHM) of less than or equal to about 45 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, less than or equal to about 28 nm, less than or equal to about 27 nm, less than or equal to about 26 nm, or less than or equal to about 25 nm. The FWHM of the quantum dot may be greater than or equal to about 1 nm, greater than or equal to about 5 nm, greater than or equal to about 10 nm, or greater than or equal to about 15 nm.

In an embodiment, the quantum dot may include an organic ligand e.g., on a surface thereof. The organic ligand may include $RCOOH$, $RNH_2$, $R_2NH$, $R_3N$, $RSH$, $RH_2PO$, $R_2HPO$, $R_3PO$, $RH_2P$, $R_2HP$, $R_3P$, $ROH$, $RCOOR'$, $RPO(OH)_2$, $RHPOOH$, $R_2POOH$, a polymeric organic ligand, or a combination thereof wherein R and R' are the same or different, and are independently a substituted or unsubstituted C1 to C40 (e.g., a C3 to C30 or a C6 to C24) aliphatic hydrocarbon (e.g., alkyl, alkenyl, or alkynyl) group or a substituted or unsubstituted C6 to C40 aromatic hydrocarbon group, or a combination thereof. Two or more different organic ligand may be used.

The organic ligand may coordinate to, e.g., be bound to, the surface of the quantum dot, helping the nanocrystal to be well dispersed in the solution. Examples of the organic ligand may include methane thiol, ethane thiol, propane thiol, butane thiol, pentane thiol, hexane thiol, octane thiol, dodecane thiol, hexadecane thiol, octadecane thiol, or benzyl thiol; methyl amine, ethyl amine, propyl amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine such as a substituted or unsubstituted methylphosphine (e.g., trimethylphosphine, methyldiphenylphosphine, etc.), a substituted or unsubstituted ethylphosphine (e.g., triethylphosphine, ethyldiphenylphosphine, etc.), a substituted or unsubstituted propylphosphine, a substituted or unsubstituted butylphosphine, a substituted or unsubstituted pentylphosphine, or a substituted or unsubstituted octylphosphine (e.g., trioctylphosphine (TOP)); a phosphine oxide such as a substituted or unsubstituted methylphosphine oxide (e.g., trimethylphosphine oxide, methyldiphenylphosphine oxide, etc.), a substituted or unsubstituted ethylphosphine oxide (e.g., triethylphosphine oxide, ethyldiphenylphosphine oxide, etc.), a substituted or unsubstituted propylphosphine oxide, a substituted or unsubstituted butylphosphine oxide, or a substituted or unsubstituted octylphosphine oxide (e.g., trioctylphosphine oxide (TOPO)); diphenylphosphine, diphenylphosphine oxide, triphenylphosphine, or triphenylphosphine oxide; a mono- or di(C5 to C20 alkyl)phosphinic acid such as a mono- or dihexylphosphinic acid, a mono- or dioctylphosphinic acid, a mono- or di(dodecyl)phosphinic acid, a mono- or di(tetradecyl)phosphinic acid, a mono- or di(hexadecyl)phosphinic acid, a mono- or di(octadecyl)phosphinic acid, or a combination thereof; a C5 to C20 alkylphosphinic acid; a C5 to C20 alkylphosphonic acid such as hexylphosphonic acid, octylphosphonic acid, dodecylphosphonic acid, tetradecylphosphonic acid, hexadecylphosphonic acid, octadecylphosphonic acid, or a combination thereof; or a combination thereof, and the like, but are not limited thereto. Two or more different organic ligand compound may be used.

In an embodiment, the organic ligand compound may be a combination of RCOOH and an amine (e.g., $RNH_2$, $R_2NH$, $R_3N$, or a combination thereof). In an embodiment, the organic ligand may not include an organic compound having a thiol moiety and an amino group, a carboxylic acid group, or a combination thereof.

In an embodiment, the organic ligand may not include a multifunctional organic compound having a thiol moiety and an amino group, a carboxylic acid group, or a combination thereof. In an embodiment, the organic ligand may not include glutathione compound. The quantum dot may be water-insoluble.

When dispersed in water, the quantum dot may show, e.g., exhibit, an average particle size of greater than or equal to about 300 nm, greater than or equal to about 400 nm, greater than or equal to about 500 nm, or greater than or equal to about 900 nm as determined by a dynamic light scattering (DLS) analysis. When dispersed in an organic solvent (such as toluene, octane, or the like), the quantum dot may be configured to form an organic solution having an average particle size of less than or equal to about 500 nm, less than or equal to about 400 nm, less than or equal to about 300 nm, less than or equal to about 200 nm, less than or equal to about 100 nm, or less than or equal to about 90 nm as determined by a DLS analysis. Examples of the organic solvent are described herein.

In an embodiment, a method of manufacturing the quantum dot(s) includes:
  preparing the core; and
  conducting a shell formation reaction between a Group II metal precursor and a chalcogen element precursor in the presence of the core and a first organic ligand in a first organic solvent to form the semiconductor nanocrystal shell on the core;
  wherein the shell formation reaction is carried out in the presence of an additive including phosphorus and fluorine.

For the preparation of the core, the formation of the nanocrystal including ZnSeTe may include preparing a zinc precursor organic solution including a zinc precursor and a second organic ligand in a second organic solvent; and
  while heating the zinc precursor organic solution at a core formation temperature, adding thereto a selenium precursor, a tellurium precursor, a hydride compound, and at least one third organic ligand different from the second organic ligand to conduct a core formation reaction.

In an embodiment, the method may further include adding the additive to a core formation reaction system during the core formation.

A reaction temperature for the core formation may be greater than or equal to about 250° C., greater than or equal to about 260° C., greater than or equal to about 270° C., greater than or equal to about 280° C., greater than or equal to about 290° C., or greater than or equal to about 300° C. The reaction temperature for the core formation may be less than or equal to about 350° C., for example, less than or equal to about 340° C., less than or equal to about 330° C., less than or equal to about 320° C., or less than or equal to about 310° C. The reaction time for the core formation is not particularly limited and may be selected appropriately, taking into consideration the precursors for the core formation, the reaction temperature, a desired size of the core, or the like.

The reaction temperature for the shell formation may be selected appropriately in any suitable range of greater than or equal to about 200° C., for example, greater than or equal to about 210° C., greater than or equal to about 220° C., greater than or equal to about 230° C., greater than or equal to about 240° C., greater than or equal to about 250° C., greater than or equal to about 260° C., greater than or equal to about 270° C., greater than or equal to about 280° C., or greater than or equal to about 290° C. and less than or equal to about 340° C., for example, less than or equal to about 325° C. The reaction time for the shell formation may be selected appropriately taking into consideration a desired shell composition, the precursors as used, the shell formation temperature, a desired shell thickness, or the like.

The additive may further include an alkali metal (e.g., lithium, sodium, potassium, or a combination thereof). In an embodiment, the additive may include a compound represented by the following chemical formula:

$$M^+PF_6^-$$

wherein M is lithium, sodium, potassium, or a combination thereof.

The additive may be dissolved in a solvent such as a C1 to C10 nitrile solvent (e.g., acetonitrile), a C2 to C20 ketone solvent (e.g., acetone), a C1 to C20 alcohol solvent (e.g., ethanol), C2 to C30 alkylene carbonate solvent such as ethylene carbonate, diethylene carbonate, methylene carbonate, dimethylene carbonate, or the like, or a combination thereof and then may be added to the reaction system.

The synthesized core may be separated from the reaction system for example by using a non-solvent, for example, prior to the shell formation. The separation using the non-solvent may be explained in detail herein.

The composition of the quantum dot and details of the formation of the shell are the same as set forth herein.

In an embodiment, the tellurium precursor used during the core synthesis may include tellurium dispersed in a second organic solvent and a concentration of the tellurium in the tellurium precursor may be greater than about 0.1 moles per liter (molar (M)), for example, greater than or equal to about 0.5 M, greater than or equal to about 1 M, greater than or equal to about 1.5 M, greater than or equal to about 2 M, or greater than or equal to about 2.5 M. The concentration of the tellurium may be less than or equal to about 10 M, less than or equal to about 5 M, or less than or equal to about 4 M. In an embodiment, using the tellurium precursor at the aforementioned concentration may contribute to enhance a reactivity of the tellurium precursor, providing an improved quality of the core.

In an embodiment, on the synthesis of the core, prior to being added to the zinc precursor organic solution, the selenium precursor, the tellurium precursor, the metal hydride compound, and the second organic ligand may be mixed together at a temperature of less than about 80° C., for example, less than or equal to about 75° C., less than or equal to about 70° C., less than or equal to about 65° C., less than or equal to about 60° C., less than or equal to about 55° C., less than or equal to about 50° C., or less than or equal to about 45° C. to form a single stock solution. The temperature may be greater than or equal to about 10° C., greater than or equal to about 20° C., or for example about room temperature.

The second organic ligand may be an aliphatic organic amine compound or a combination thereof. The metal hydride compound may include lithium, aluminum, or a combination thereof. The metal hydride compound may include an aluminum hydride compound, a lithium hydride compound, or a combination thereof. The metal hydride compound may include an organic metal hydride compound (for example, having a, e.g., at least one, hydrocarbon group), an inorganic metal hydride compound, or a combination thereof. The metal hydride compound may include an alkyl lithium hydride (e.g., a dialkyl lithium borohydride wherein each alkyl group may have from 1 to 6 carbon atoms), a lithium aluminum hydride compound, or a combination thereof.

An amount of the metal hydride is not particularly limited and may be selected appropriately. An amount of the metal hydride may be, per one mole of tellurium, greater than or equal to about 0.01 moles, greater than or equal to about 0.05 moles, greater than or equal to about 0.1 moles, greater than or equal to about 0.5 moles, or greater than or equal to about 1 mole. An amount of the metal hydride may be, per one mole of tellurium, less than or equal to about 10 moles, less than or equal to about 5 moles, or less than or equal to about 3 moles.

During preparation of the core, a mole ratio of the tellurium with respect to the selenium introduced into the reaction system (Te:Se) may be greater than about 0.25:1, greater than or equal to about 0.3:1, greater than or equal to about 0.4:1, greater than or equal to about 0.5:1, greater than or equal to about 0.7:1, greater than or equal to about 0.9:1, greater than or equal to about 1:1, greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, or greater than or equal to about 2.5:1.

During preparation of the core, a mole ratio of the tellurium with respect to the selenium introduced into the reaction system (Te:Se) may be less than or equal to about 10:1, less than or equal to about 9:1, less than or equal to about 8:1, less than or equal to about 7:1, less than or equal to about 6:1, less than or equal to about 5:1, less than or equal to about 4:1, less than or equal to about 3:1, less than or equal to about 2:1, or less than or equal to about 1.5:1.

During preparation of the core, a mole ratio of the zinc with respect to the tellurium may be selected appropriately taking into consideration a desired composition, the precursor(s), or the like. According to an embodiment, during preparation of the core, an amount of the zinc with respect to one mole of the tellurium may be greater than or equal to about 1 mole, greater than or equal to about 2 moles, greater than or equal to about 3 moles, greater than or equal to about 4 moles, or greater than or equal to about 5 moles. According to an embodiment, during preparation of the core, an amount of the zinc with respect to one mole of the tellurium may be, less than or equal to about 20 moles, less than or equal to about 15 moles, less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, or less than or equal to about 2 moles.

In an embodiment, formation of the shell may include heating (or vacuum treating) an organic ligand in an organic solvent at a predetermined temperature (e.g., at a temperature of greater than or equal to about 100° C., for example, greater than or equal to about 120° C.) under vacuum, changing an atmosphere of a reaction system into an inert gas and heating the same at a predetermined reaction temperature. To the heated reaction system may be added a Group IIB metal precursor (hereinafter, explanation may be made for an embodiment using the zinc precursor, but is not limited thereto) and a chalcogen element precursor together with the additive including the phosphorus and the fluorine while heating the reaction system to the shell formation temperature. For the duration of the reaction, the Group IIB metal precursor and the chalcogen element precursor may be added simultaneously or in any suitable order taking into consideration a desired shell composition. The addition of the shell precursor may be controlled or adjusted in order to achieve a shell having a desired composition (e.g., a single composition or a gradient or a multi-layered composition).

In an embodiment, the formation of the semiconductor nanocrystal shell may include reacting the zinc precursor with the selenium precursor, the sulfur precursor, or a combination thereof. In an embodiment, a zinc precursor may react with a selenium precursor to form a first layer including zinc and selenium and then reacted with a sulfur precursor to form a second layer including zinc and sulfur. In an embodiment, the semiconductor nanocrystal shell formation may include reacting the zinc precursor and the selenium precursor and then reacting the zinc precursor and the sulfur precursor. In an embodiment, a zinc precursor may react with the selenium and the sulfur precursors to form a semiconductor nanocrystal shell including zinc, selenium, and sulfur (e.g., ZnSeS).

In an embodiment, the additive may be added during the formation of the first shell layer, the formation of the second shell layer, or the formation of the first and second shell layers. The additive may be dissolved, dispersed, or a combination thereof in an appropriate organic solvent (such as an alkyl cyanide) and then added to the reaction system.

In an embodiment, the Group II metal precursor may include a metal powder (a Zn powder), a metal oxide (e.g., ZnO), an alkylated metal compound (e.g., C2 to C30 alkyl (e.g., dialkyl) zinc such as dimethyl zinc, diethyl zinc), a metal alkoxide (e.g., a metal ethoxide), a metal carboxylate (e.g., a metal acetate or zinc aliphatic carboxylate, for example, zinc long chain aliphatic carboxylate such as zinc oleate), a metal nitrate, a metal perchlorate, a metal sulfate, a metal acetylacetonate, a metal halide (e.g., a metal chloride), a metal cyanide, a metal hydroxide, a metal carbonate, a metal peroxide, or a combination thereof. The Group II metal precursor may include zinc. The Group II metal may be zinc. Examples of the Group II metal precursor including zinc may include dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, or a combination thereof.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

The tellurium precursor may include tellurium-trioctylphosphine (Te-TOP), tellurium-tributylphosphine (Te-TBP), tellurium-triphenylphosphine (Te-TPP), tellurium-diphenylphosphine (Te-DPP), or a combination thereof, but is not limited thereto.

The sulfur precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), sulfur-octadecene (S-ODE), bis(trimethylsilylmethyl) sulfide, ammonium sulfide, sodium sulfide, or a combination thereof.

The additive may include lithium hexafluorophosphate, sodium hexafluorophosphate, potassium hexafluorophosphate, cesium hexafluorophosphate, or a combination thereof. Without wishing to be bound by any theory, the additive may be decomposed in the shell reaction system (e.g., as it is being heated) in a variety of paths, e.g., a variety of pathways, to provide a chemical species (e.g., a pentafluorophosphate, hexafluorophosphate, a fluorine acid, or the like) that can play a role of modification for the surface of the core particle or the shell formed on the particle. The chemical species as provided may cause a surface reaction beneficial to the shell formation without having a substantially adverse effect thereon. Accordingly, the method of an embodiment may provide a quantum dot having an improved quality of the shell.

The first organic solvent and second organic solvent may be same as or different from each other. The first organic solvent and second organic solvent, (hereinafter, simply referred to as an organic solvent) may be a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctylphosphine) substituted with a, e.g., at least one (e.g., 1, 2, or 3), C6 to C22 alkyl group, a phosphine oxide (e.g., trioctylphosphine oxide) substituted with a, e.g., at least one (e.g., 1, 2, or 3), C6 to C22 alkyl group, a C12 to C22 aromatic ether such as a phenyl ether or a benzyl ether, or a combination thereof.

At least two, or all of the first organic ligand, the second organic ligand, and the third organic ligand may each be the same. At least two, or all of the first organic ligand, the second organic ligand, and the third organic ligand may each be different. Details of the first and the second organic ligands and the shell formation organic ligand are the same as set forth herein with regard to the organic ligand.

In an embodiment, the second organic ligand may include a fatty acid (e.g., including a C5 or greater, a C10 or greater, or a C15 or greater aliphatic hydrocarbon group) and the third organic ligand may include a fatty organic amine (for example, a primary amine including a C5 or greater, C10 or greater, or C15 or greater aliphatic or aromatic hydrocarbon group) or a combination thereof. The fatty organic amine may be a compound represented by $RNH_2$ wherein R is a C5 to C40 aliphatic hydrocarbon group such as alkyl, alkenyl, or alkynyl or a C6 to C40 aryl group. The carbon number of the aliphatic hydrocarbon group may be greater than or equal to about 5, greater than or equal to about 10, greater than or equal to about 15, greater than or equal to about 16, greater than or equal to about 17, greater than or equal to about 18, greater than or equal to about 19, or greater than or equal to about 20; less than or equal to about 50, less than or equal to about 40, or less than or equal to about 30; or a combination thereof.

Amounts of the second organic ligand and the third organic ligand may be selected taking into consideration a type of the organic ligand and a type of the precursor. An amount of the second organic ligand (or an amount of the second ligand or an amount of the shell formation organic ligand) may be, with respect to 1 mole of the zinc precursor, greater than or equal to about 0.1 moles, greater than or equal to about 0.2 moles, greater than or equal to about 0.3 moles, greater than or equal to about 0.4 moles, greater than or equal to about 0.5 moles, greater than or equal to about 0.6 moles, greater than or equal to about 0.7 moles, greater than or equal to about 0.8 moles, greater than or equal to about 0.9 moles, greater than or equal to about 1 mole, greater than or equal to about 2 moles, greater than or equal to about 3 moles, greater than or equal to about 4 moles, or greater than or equal to about 5 moles. An amount of the first organic ligand (or an amount of the second ligand or an amount of the shell formation organic ligand) may be, with respect to 1 mole of the zinc precursor, less than or equal to about 20 moles, less than or equal to about 19 moles, less than or equal to about 18 moles, less than or equal to about 17 moles, less than or equal to about 16 moles, less than or equal to about 15 moles, less than or equal to about 14 moles, less than or equal to about 13 moles, less than or equal to about 12 moles, less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, less than or equal to about 2 moles, or less than or equal to about 1 mole.

A mole ratio between the second organic ligand and the third organic ligand (the second organic ligand:the third organic ligand) may be, for example, 1:about 0.1 or greater, 1:about 0.5 or greater, 1:about 0.9 or greater, or 1:about 1 or greater; 1:about 10 or less; 1:about 5 or less, 1:about 2.5 or less, or 1:about 1.5 or less.

The amount of the additive used in the shell formation reaction may be controlled appropriately in view of the type of the additive, the organic solvent, or the like. In an embodiment, the amount of the additive may be controlled such that the added amount of the phosphorus or the fluorine) may be, per 10 milliliters (mL) of the reaction medium, greater than or equal to about 0.00005 millimoles (mmol), greater than or equal to about 0.0001 mmol, greater than or equal to about 0.0.001 mmol, greater than or equal to about 0.005 mmol, greater than or equal to about 0.01 mmol, or greater than or equal to about 0.05 mmol and less than or equal to about 10 mmol, less than or equal to about 9 mmol, less than or equal to about 8 mmol, less than or equal to about 7 mmol, less than or equal to about 6 mmol, less than or equal to about 5 mmol, less than or equal to about 4 mmol, less than or equal to about 3 mmol, less than or equal to about 2 mmol, or less than or equal to about 1 mmol.

In an embodiment, the selenium precursor, the tellurium precursor, the metal hydride compound may be injected into the zinc precursor organic solution in a mixed state optionally together with the organic ligand. In an embodiment, the selenium precursor, the tellurium precursor, and the metal hydride compound may be injected into the zinc precursor organic solution sequentially.

In a reaction system for the core formation and a reaction system for the shell formation, an amount of each precursor and a concentration thereof may be selected taking into consideration a desired composition of the core and the shell, a reactivity between the core and shell precursors, or the like. In an embodiment, taking into consideration a desired composition of a final quantum dot (e.g., a ratio, e.g., mole ratio, between elements such as Zn, S, Se, Te, or a combination thereof), ratios between the precursors may be controlled. The composition of the final quantum dot may be determined by an appropriate analysis tool such as an inductively coupled plasma atomic emission spectroscopy.

After the formation of the core, the shell, or a combination thereof, a non-solvent is added to reaction products and the nanocrystal particles coordinated with, e.g., bound to, the ligand compound may be separated. The non-solvent may be a polar solvent that is miscible with the solvent used in the core formation reaction, shell formation reaction, or a combination thereof and is not capable of dispersing the produced nanocrystals therein. The non-solvent may be selected taking into consideration the solvent used in the reaction and may be for example acetone, ethanol, butanol, isopropanol, ethanediol, water, tetrahydrofuran (THF), dimethylsulfoxide (DMSO), diethyl ether, formaldehyde, acetaldehyde, a solvent having a similar solubility parameter to the foregoing non-solvents, or a combination thereof. Separation of the nanocrystal particles may involve centrifugation, sedimentation, chromatography, or distillation. The separated nanocrystal particles may be added to a washing (or dispersing) solvent and washed (or dispersed), if desired. Types of the washing (dispersing) solvent are not particularly limited and a solvent having similar solubility parameter to that of the ligand may be used and examples thereof may include hexane, heptane, octane, chloroform, toluene, benzene, or the like.

In an embodiment, the organic ligand may not include a multifunctional organic compound having a thiol moiety and an amino group, a carboxylic acid group, or a combination thereof. In an embodiment, the organic ligand may not include glutathione compound. The quantum dot may be water-insoluble.

When dispersed in water, the quantum dot may show, e.g., exhibit, an average particle size of greater than or equal to about 300 nm, greater than or equal to about 400 nm, greater than or equal to about 500 nm, or greater than or equal to about 900 nm as determined by a dynamic light scattering (DLS) analysis. When dispersed in an organic solvent (such as toluene, octane, or the like), the quantum dot may be configured to form an organic solution having an average particle size of less than or equal to about 500 nm, less than or equal to about 400 nm, less than or equal to about 300 nm, less than or equal to about 200 nm, less than or equal to about 100 nm, or less than or equal to about 90 nm as determined by a DLS analysis. Examples of the organic solvent are described herein.

In an embodiment, a quantum dot composition includes the aforementioned (e.g., a plurality of) quantum dot(s); an organic solvent, a liquid vehicle, or a combination thereof; and optionally a monomer, a dispersing agent, or a combination thereof. The dispersing agent may disperse the quantum dot. The dispersing agent may include a carboxylic acid group containing compound (e.g., a monomer or a polymer). The composition may include a (photo)polymerizable monomer having a, e.g., at least one, carbon-carbon double bond, a (photo or a thermal) initiator; or a combination thereof. The composition may be a photosensitive composition.

Details of the quantum dots in the composition are as described herein. An amount of the quantum dot(s) in the composition (or a composite as described herein) may be appropriately adjusted taking into consideration a desirable final use (e.g., a photoluminescent color filter, etc.) and components of the composition (or the composite). In an embodiment, the amount of the quantum dot may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a total weight or a total solids content of the composition. The amount of the quantum dot may be less than or equal to about 70 wt %, for example, less than or equal to about 65 wt %, less than or equal to about 60 wt %, less than or equal to about 55 wt %, or less than or equal to about 50 wt %, based on a total weight or a total solids content of the composition. The weight percentage of the components relative to the total solids content in the composition may represent the contents of the components in the composite, which will be described herein.

In the composition according to an embodiment, the dispersing agent may ensure dispersion of the quantum dots. In an embodiment, the dispersing agent may be a binder (or binder polymer). The binder may include an organic compound (e.g., a monomer or a polymer) optionally including a carboxylic acid group (e.g., in the repeating unit). The binder may be an insulating polymer.

The organic compound including a carboxylic acid group may include a copolymer of a monomer mixture including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a multiple aromatic ring-containing polymer having a backbone structure in which two aromatic rings are bound to a quaternary carbon atom that is a constituent atom of another cyclic moiety in the main chain and including a carboxylic acid group (—COOH) (hereinafter, a cardo binder); or a combination thereof.

The dispersing agent may include the first monomer, the second monomer, the third monomer, or a combination thereof.

In the composition, an amount of the dispersing agent or the binder polymer may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on a total weight or a total solid content of the composition, but is not limited thereto. The amount of the dispersing agent or the binder polymer may be less than or equal to about 35 wt %, for example less than or equal to about 33 wt %, or less than or equal to about 30 wt %, based on a total weight or a total solid content of the composition. The amount of the dispersing agent or the binder polymer may be about 0.5 wt % to about 55 wt %, based on a total weight or a total solid content of the composition.

In the composition, the polymerizable (e.g., photopolymerizable) monomer (hereinafter, may be referred to as "monomer") including the carbon-carbon double bond may include a (e.g., photopolymerizable) (meth)acryl-based, i.e., (meth)acryl-containing, monomer. The monomer may be a precursor for an insulating polymer.

An amount of the monomer may be greater than or equal to about 0.5 wt %, for example, greater than or equal to about 1 wt %, or greater than or equal to about 2 wt %, based on a total weight of the composition. The amount of the monomer may be less than or equal to about 30 wt %, for example, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %, based on a total weight of the composition.

The (photo)initiator included in the composition is a compound that imitates (photo)polymerization of the aforementioned monomers in the composition. The initiator is a compound accelerating a radical reaction (e.g., radical polymerization of monomer) by producing radical chemical species under a mild condition (e.g., by heat or light). The initiator may be a thermal initiator or a photoinitiator. The initiator is not particularly limited and may be appropriately selected.

In the composition, an amount of the initiator may be appropriately adjusted considering types and amounts of the polymerizable monomers. In an embodiment, the amount of the initiator may be greater than or equal to about 0.01 wt %, for example, greater than or equal to about 1 wt % and less than or equal to about 10 wt %, for example, less than or equal to about 9 wt %, less than or equal to about 8 wt %, less than or equal to about 7 wt %, less than or equal to about 6 wt %, or less than or equal to about 5 wt %, based on a total weight (or a total weight of the solid content) of the composition, but is not limited thereto.

The composition (or the composite that will be described herein) may further include a (multiple or mono-functional) thiol compound having at least one thiol group at the terminal end, a metal oxide particulate, or a combination thereof.

The metal oxide particulate may include $TiO_2$, $SiO_2$, $BaTiO_3$, $Ba_2TiO_4$, ZnO, or a combination thereof. In the composition, an amount of the metal oxide particulate may be greater than or equal to about 1 wt %, greater than or equal to about 5 wt %, or greater than or equal to about 10 wt % and less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, or less than or equal to about 5 wt %, based on a total weight (or a solid content) of the composition. The metal oxide particulate may be non-emissive (e.g., not emitting light). The metal oxide may include an oxide of a metal or a metalloid.

The metal oxide particulate may have an appropriately selected diameter without a particular limit. The diameter of the metal oxide particulate may be greater than or equal to about 100 nm, for example, greater than or equal to about 150 nm, or greater than or equal to about 200 nm and less than or equal to about 1000 nm or less than or equal to about 800 nm.

The multiple thiol compound may be a dithiol compound, a trithiol compound, a tetrathiol compound, or a combination thereof. For example, the thiol compound may be glycoldi-3-mercaptopropionate, glycoldimercaptoacetate, trimethylolpropane-tris(3-mercaptopropionate), pentaerythritol tetrakis(3-mercaptopropionate), pentaerythritol tetrakis (2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

An amount of the thiol compound may be less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt %, based on a total weight or a total solid content of the composition. The amount of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, or greater than or equal to about 15 wt %, based on a total weight or a total solid content of the composition.

The composition may further include an organic solvent (or a liquid vehicle, hereinafter referred to as a solvent). Types of the usable organic solvent are not particularly limited. Examples of the solvent may include, but are not limited to: ethyl 3-ethoxy propionate; an ethylene glycol series such as ethylene glycol, diethylene glycol, or polyethylene glycol; a glycol ether series such as ethylene glycol monomethyl ether, ethylene glycol monoethyl ether, diethylene glycol monomethyl ether, ethylene glycol diethyl ether, or diethylene glycol dimethyl ether; glycol ether acetates series such as ethylene glycol monomethyl ether acetate, ethylene glycol monoethyl ether acetate, diethylene glycol monoethyl ether acetate, or diethylene glycol monobutyl ether acetate; a propylene glycol series such as propylene glycol; a propylene glycol ether series such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, or dipropylene glycol diethyl ether; a propylene glycol ether acetate series such as propylene glycol monomethyl ether acetate or dipropylene glycol monoethyl ether acetate; an amide series such as N-methylpyrrolidone, dimethyl formamide, or dimethyl acetamide; a ketone series such as methyl ethyl ketone (MEK), methyl isobutyl ketone (MIBK), or cyclohexanone; a petroleum product such as toluene, xylene, or solvent naphtha; an ester series such as ethyl acetate, propyl acetate, butyl acetate, cyclohexyl acetate, or ethyl lactate; an ether such as diethyl ether, dipropyl ether, or dibutyl ether; chloroform, a C1 to C40 aliphatic hydrocarbon (e.g., alkane, alkene, or alkyne), a halogen (e.g., chloro) substituted C1 to C40 aliphatic hydrocarbon (e.g., dichloroethane, trichloromethane, or the like), a C6 to C40 aromatic hydrocarbon (e.g., toluene, xylene, or the like), a halogen (e.g., chloro) substituted C6 to C40 aromatic hydrocarbon, or a combination thereof.

Types and amounts of the solvent may be appropriately selected by taking into consideration the aforementioned main components (i.e., the quantum dot, the dispersing agent, the photopolymerizable monomer, the photoinitiator, and if used, the thiol compound), and types and amounts of additives which will be described herein. The composition may include a solvent in a residual amount except for a desired amount of the solid content (non-volatile components).

The composition (e.g., an ink jet composition) may have a viscosity at 25° C. of greater than or equal to about 4 centiPoise (cPs), greater than or equal to about 5 cPs, greater than or equal to about 5.5 cPs, greater than or equal to about 6.0 cPs, or greater than or equal to about 7.0 cPs. The composition (e.g., an ink jet composition) may have a viscosity at 25° C. of less than or equal to about 12 cPs, less than or equal to about 10 cPs, or less than or equal to about 9 cPs.

If the composition is applied in an ink jet process, the composition may be discharged onto a substrate at room temperature and may form a quantum dot polymer composite or a pattern of quantum dot polymer composite, for example, by heating. Together with the disclosed viscosity, the ink composition may have a surface tension at 23° C. of greater than or equal to about 21 milliNewtons per meter (mN/m), greater than or equal to about 22 mN/m, greater than or equal to about 23 mN/m, greater than or equal to about 24 mN/m, greater than or equal to about 25 mN/m, greater than or equal to about 26 mN/m, greater than or equal to about 27 mN/m, greater than or equal to about 28 mN/m, greater than or equal to about 29 mN/m, greater than or equal to about 30 mN/m, or greater than or equal to about 31 mN/m and less than or equal to about 40 mN/m, less than or equal to about 39 mN/m, less than or equal to about 38 mN/m, less than or equal to about 37 mN/m, less than or equal to about 36 mN/m, less than or equal to about 35 mN/m, less than or equal to about 34 mN/m, less than or equal to about 33 mN/m, or less than or equal to about 32 mN/m. A surface tension of the ink composition may be less than or equal to about 31 mN/m, less than or equal to about 30 mN/m, less than or equal to about 29 mN/m, or less than or equal to about 28 mN/m.

If desired, the composition may further include various additives such as a light diffusing agent, a leveling agent, or a coupling agent in addition to the aforementioned components.

The components (binder, monomer, solvent, additive, thiol compound, cardo binder, etc.) included in the composition (e.g., a photoresist composition) of an embodiment may be appropriately selected, as described in, for example, US-2017-0052444-A1.

The composition according to an embodiment may be prepared by a method including preparing quantum dot dispersion including the aforementioned quantum dots, dispersing agent, and solvent; and mixing the quantum dot dispersion with the initiator, the polymerizable monomer (e.g., an acryl-based monomer), optionally, the thiol compound, optionally, the metal oxide particulates, and optionally, the aforementioned additive. Each of the aforementioned components may be mixed sequentially or simultaneously, but mixing orders are not particularly limited.

The composition according to an embodiment may be used to provide a quantum dot composite pattern (e.g., a patterned quantum dot polymer composite. The composition may provide a quantum dot-polymer composite by a (e.g., radical) polymerization. The composition according to an embodiment may be a photoresist composition including quantum dots applicable to a photolithography method. The composition according to an embodiment may be an ink composition that may provide a pattern by printing (e.g., a droplet discharge method such as inkjet printing).

In an embodiment, the quantum dot (polymer) composite includes a matrix (e.g., a polymer matrix); and the aforementioned quantum dot dispersed in the matrix. The quantum dot matrix may further include the metal oxide particulate dispersed in the matrix. The (polymer) matrix may include a linear polymer, a crosslinked polymer, or a combination thereof. The crosslinked polymer may include a thiolene resin, crosslinked poly(meth)acrylate, crosslinked polyurethane, a crosslinked epoxy resin, a crosslinked vinyl polymer, a crosslinked silicone resin, or a combination thereof. The linear polymer may include a repeating unit derived from carbon-carbon unsaturated bonds (e.g., carbon-carbon double bond). The repeating unit may include a carboxylic acid group. The linear polymer may include an ethylene repeating unit.

The matrix may include a dispersing agent (e.g., a binder monomer or polymer including a carboxylic acid group), a polymerization product (e.g., insulating polymer) of a polymerizable monomer having a carbon-carbon double bond (at least one, for example, at least two, at least three, at least four, or at least five), optionally a polymerization product of the polymerizable monomer and a thiol compound (e.g., a polythiol compound having at least two thiol groups for example, at a terminal end thereof), or a combination thereof.

The cross-linked polymer may include a thiolene resin, a cross-linked poly(meth)acrylate, or a combination thereof. In an embodiment, the cross-linked polymer may be a polymerization product of the polymerizable monomer and, optionally, a polythiol compound having at least two thiol groups (e.g., at a terminal end thereof). The quantum dot, the dispersing agent, or the binder polymer, the polymerizable monomer, and the polythiol compound may be the same as described herein.

A film of the quantum dot-polymer composite (or a pattern thereof as described herein) may have for example a thickness of less than or equal to about 30 micrometers ($\mu m$), for example, less than or equal to about 25 $\mu m$, less than or equal to about 20 $\mu m$, less than or equal to about 15 $\mu m$, less than or equal to about 10 $\mu m$, less than or equal to about 8 $\mu m$, or less than or equal to about 7 $\mu m$ and greater than or equal to about 2 $\mu m$, for example, greater than or equal to about 3 $\mu m$, greater than or equal to about 3.5 $\mu m$, greater than or equal to about 4 $\mu m$, greater than or equal to about 5 $\mu m$, or greater than or equal to about 6 $\mu m$.

In an embodiment, a patterned film of the quantum dot composite may include at least one repeating section configured to emit predetermined light. In an embodiment, the repeating section may include a first section configured to emit first light. The repeating section may further include a second section emitting a second light having different wavelength from the first light. The first section, the second section, or a combination thereof may include the aforementioned quantum dot (polymer) composite. The first light or the second light may be red light having a maximum photoluminescence peak wavelength that is between about 600 nm and about 650 nm (e.g., about 620 nm to about 650 nm), or green light having a maximum photoluminescence peak wavelength that is between about 500 nm and about 550 nm (e.g., about 510 nm to about 540 nm). The patterned film may further include a third section that may pass or emit a third light (e.g., blue light) different from the first light and the second light. The third light may include an excitation light. The third light (or the excitation light) may include blue light having a maximum peak wavelength ranging from about 380 nm to about 480 nm and optionally green light.

In an embodiment, a patterned quantum dot composite film may be produced by a method using the photoresist composition. The method may include:

forming a film of the composition on a substrate (S1);
optionally prebaking the film (S2);
exposing a selected region of the film to light (e.g., a wavelength of less than or equal to about 400 nm) (S3); and
developing the exposed film with an alkali developing solution to obtain a pattern including the quantum dot-polymer composite (S4).

Non-limiting methods of forming the pattern are illustrated, referring to FIG. 1A.

The composition may be coated to have a predetermined thickness on a substrate in an appropriate method of spin coating, slit coating, and the like (S1). The formed film may be, optionally, pre-baked (PRB) (S2). The pre-baking may be performed by selecting appropriate conditions of temperature, time, atmosphere, and the like.

The formed (or optionally pre-baked) film may be exposed to light having a predetermined wavelength under a mask (e.g., a photomask used in a photolithography process) having a predetermined pattern (S3). A wavelength and intensity of the light may be selected by taking into consideration the initiator (e.g., photoinitiator), an amount of the initiator (e.g., photoinitiator), the quantum dots, amounts of the quantum dots, and the like.

The exposed film may be treated with an alkali developing solution (e.g., dipping or spraying) to dissolve an unexposed region and obtain a desired pattern (S4). The obtained pattern may be, optionally, post-baked (FOB) to improve crack resistance and solvent resistance of the pattern, for example, at about 150° C. to about 230° C. for a predetermined time (e.g., greater than or equal to about 10 minutes or greater than or equal to about 20 minutes) (S5).

In an embodiment in which the quantum dot-polymer composite pattern has a plurality of repeating sections, a quantum dot-polymer composite having a desired pattern may be obtained by preparing a plurality of compositions including a quantum dot having desired photoluminescence properties (a photoluminescence peak wavelength and the like) to form each repeating section (e.g., a red light emitting quantum dot, a green light emitting quantum dot, or optionally, a blue light emitting quantum dot) and an appropriate number of times (e.g., two or more times or three or more times) repeating a formation of the pattern about each composition (S6). For example, the quantum dot-polymer composite may have, e.g., be provided in, a pattern including at least two repeating color sections (e.g., RGB sections). The quantum dot-polymer composite pattern may be used as a photoluminescence-type color filter in a display device.

Figure 1B:
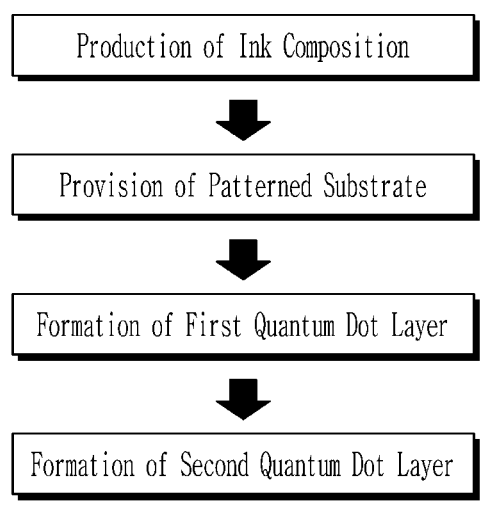
FIG. 1B schematically represents a process of producing a quantum dot composite pattern using an ink composition.

A quantum dot composite pattern may be formed by using an ink composition configured to form a pattern via an ink jet manner. Referring to FIG. 1B, the method includes preparing an ink composition; obtaining a substrate including a pattern of, for example, an electrode and optionally a pixel area formed by a bank; depositing an ink composition on the substrate (or the pixel area) to form a first quantum dot layer (or a first repeating section); and depositing an ink composition on the substrate (or the pixel area) to form a second quantum dot layer (or a second repeating section). Formation of the first quantum dot layer and the second quantum dot layer may be carried out simultaneously or sequentially.

Deposition of the ink composition may be carried out using an appropriate droplet discharging system such as an ink jet printer or a nozzle printing system (e.g., having an ink reservoir and a, e.g., at least one, printer head). The deposited ink composition may be heated to remove a solvent and optionally to carry out a polymerization, and thus, provide a (first or second) quantum dot layer. The method may provide a highly precise quantum dot-polymer composite film or pattern in a relatively simple way in a relatively short period of time.

The aforementioned quantum dot or quantum dot composite (pattern) may be included in an electronic device. Such an electronic device may include a display device, a light emitting diode (LED), an organic light emitting diode (OLED), a quantum dot LED, a sensor, a solar cell, an imaging sensor, a photodetector, or a liquid crystal display device, but is not limited thereto. The aforementioned quantum dots may be included in an electronic apparatus. Such an electronic apparatus may include a portable terminal device, a monitor, a notebook personal computer (PC), a television, an electronic display, a camera, an automobile, and the like, but are not limited thereto. The electronic apparatus may be a portable terminal device including a display device (or light emitting device) including quantum dots, a monitor, a notebook PC, or a television. The electronic apparatus may be a camera or a portable terminal device including an image sensor including quantum dots. The electronic apparatus may be a camera or a vehicle including a photodetector including quantum dots.

The device (display device or light emitting device) may further include a luminescent element, e.g., light emitting element, and optionally a light source. The luminescent element may include a light emitting layer. The luminescent element may further include a substrate, and the light emitting layer may be disposed on one surface of the substrate. The light emitting layer may include a film or patterned film of the quantum dot composite. The light source may be configured to provide incident light to the luminescent element. The incident light may have a photoluminescence peak wavelength in a range of greater than or equal to about 440 nm, for example, greater than or equal to about 450 nm and less than or equal to about 500 nm, for example, less than or equal to about 480 nm, less than or equal to about 470 nm, or less than or equal to about 460 nm.

Figure 2:
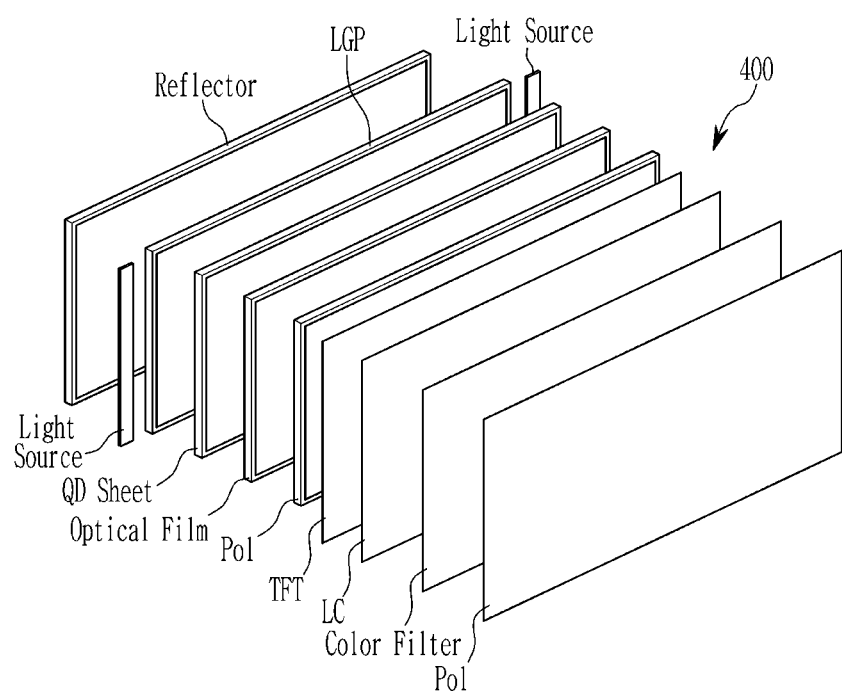
FIG. 2 is an exploded view of a display device according to an embodiment.

In an embodiment, the luminescent element or the light emitting layer may include a sheet of the quantum dot composite. Referring to FIG. 2, a photoluminescence type device 400 includes a backlight unit and a liquid crystal panel, and the backlight unit may include a quantum dot polymer composite sheet (QD sheet). Specifically, the backlight unit may include a reflector, a light guide plate (LGP), a light source (blue LED, etc.), a quantum dot polymer composite sheet (QD sheet), and optical films (prism, dual brightness enhancement film (DBEF), etc.) and the like). The liquid crystal panel may be disposed on the backlight unit and may have a structure including a thin film transistor (TFT), liquid crystal (LC), and a color filter between two polarizers (Pol). The quantum dot polymer composite sheet (QD sheet) may include quantum dots emitting red light and quantum dots emitting green light by absorbing light from a light source. Blue light from the light source may pass through the quantum dot polymer composite sheet, being combined with red light and green light emitted from quantum dots and converted to white light. The white light may be separated to blue light, green light, and red light by a color filter in the liquid crystal panel and may be emitted to the outside in each pixel.

In an embodiment, the light emitting layer may be disposed on a front surface (e.g., a light extraction surface) of a device (light emitting device or display device) in a form of a quantum dot (or a composite thereof) patterned film. The patterned film may include a repeating section configured to emit a desired light. The repeating section may include a first section. The first section may be a red light emitting section. The repeating section may include a second section. The second section may include a green light emitting section. The repeating section may include a third section. The third section may be a section that emits or transmits blue light. Details of the first, second, and third sections are as described herein.

The light source may be an element that can provide the light emitting layer with incident light and/or emit excitation light. The incident or excitation light may include blue light and, optionally, green light. The light source may include an LED. The light source may include an organic LED (OLED). On the front surface (light emitting surface) of the first section and the second section, an optical element to block (e.g., reflect or absorb) blue light (and optionally green light) for example, a blue light (and optionally green light) blocking layer or a first optical filter that will be described herein may be disposed. When the light source includes organic light emitting diode to emit blue light and an organic light emitting diode to emit green light, a green light removing filter may be further disposed on a third section through which blue light is transmitted.

The light source may include a plurality of light emitting units respectively corresponding to the first section and the second section, and the light emitting units may include a first electrode and a second electrode facing each other and an (organic) electroluminescent layer between the first electrode and the second electrode. The electroluminescent layer may include an organic light emitting material. For example, each light emitting unit of the light source may include an electroluminescent device (e.g., an organic light emitting diode (OLED)) structured to emit light of a predetermined wavelength (e.g., blue light, green light, or a combination thereof). Structures and materials of the electroluminescent device and the organic light emitting diode (OLED) are not particularly limited.

Figure 3A:
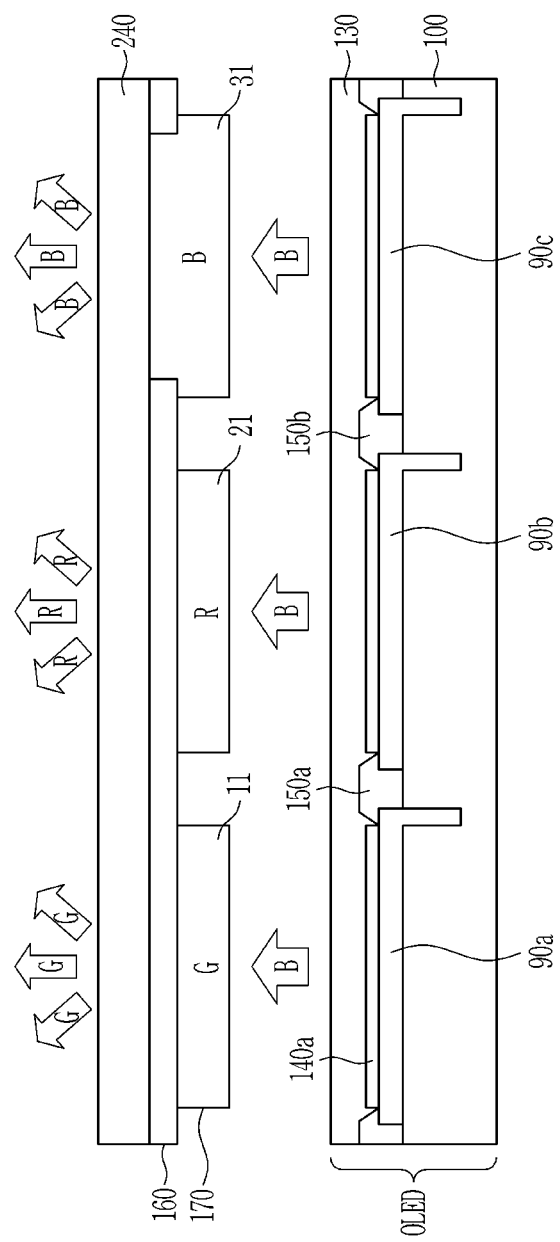
FIG. 3A is a schematic cross-sectional view of a display device according to an embodiment.
Figure 3B:
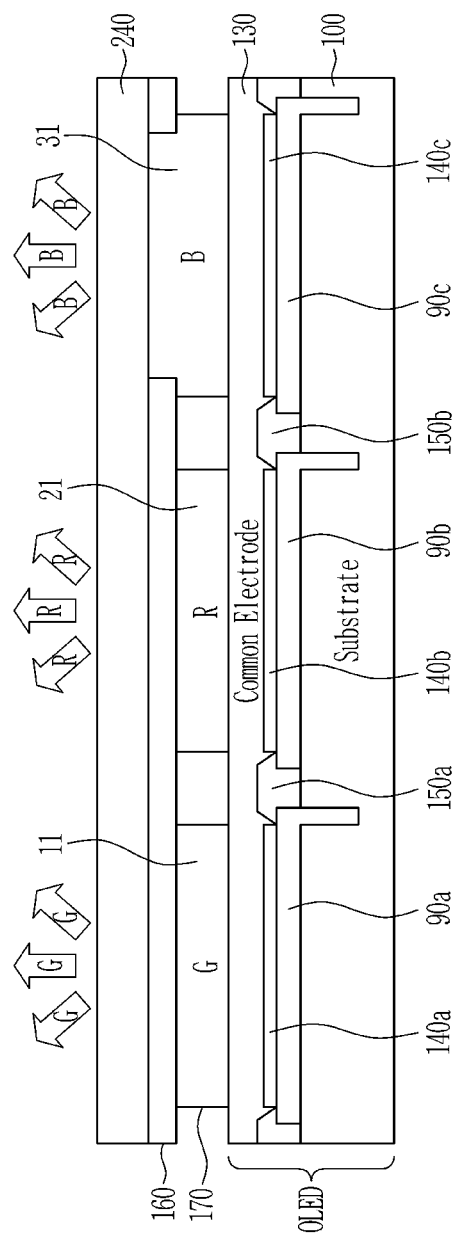
FIG. 3B is a schematic cross-sectional view of a display device according to an embodiment.

FIG. 3A is a schematic cross-sectional view of a display device according to an embodiment and FIG. 3B is a schematic cross-sectional view of a display device according to an embodiment. Referring to FIGS. 3A and 3B, the light source includes an organic light emitting diode (OLED) that emits blue (B) light (and optionally green light). The organic light emitting diode (OLED) may include at least two pixel electrodes 90a, 90b, 90c formed on the substrate 100, a pixel define layer 150a, 150b formed between the adjacent pixel electrodes 90a, 90b, 90c, an organic light emitting layer 140a, 140b, 140c formed on each pixel electrode 90a, 90b, 90c, and a common electrode layer 130 formed on the organic light emitting layer 140a, 140b, 140c. A thin film transistor and a substrate may be disposed under the organic light emitting diode (OLED). A laminated structure including the quantum dot composite pattern 170 (e.g., a first section 11 or R including red light emitting quantum dots, a second section 21 or G including green light emitting quantum dots, and a third section 31 or B including or not including a quantum dot, e.g., a blue light emitting quantum dot) pattern and substrate 240 may be disposed on the light source. The blue light emitted from the light source enters the first section and second section and may emit red light and green light, respectively. The blue light emitted from the light source may pass through the third section. An element (first optical filter 160 or excitation light blocking layer) configured to block the excitation light may be disposed between the quantum dot composite layers R and G and the substrate, as desired. When the excitation light includes blue light and green light, a green light blocking filter may be added to the third section. The first optical filter or the excitation light blocking layer will be described in more detail herein.

Such a (display) device may be produced by separately producing the aforementioned laminated structure and LED or OLED (e.g., emitting blue light) and then combining them. The (display) device may be produced by directly forming the quantum dot composite pattern on the LED or OLED.

The substrate may be a substrate including an insulation material. The substrate may include glass; various polymers such as a polyester of polyethylene terephthalate (PET), polyethylene naphthalate (PEN), and the like, polycarbonate, and polyacrylate; a polysiloxane (e.g., polydimethylsiloxane (PDMS)); an inorganic material such as $Al_2O_3$ or ZnO; or a combination thereof, but is not limited thereto. A thickness of the substrate may be appropriately selected taking into consideration a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dots.

A wire layer including a thin film transistor or the like is formed on the substrate. The wire layer may further include a gate line, a sustain voltage line, a gate insulating layer, a data line, a source electrode, a drain electrode, a semiconductor, a protective layer, and the like. The detailed structure of the wire layer may vary depending on an embodiment. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described herein.

The pixel electrode may function as an electrode (e.g., anode) of the display device. The pixel electrode may be formed of a transparent conductive material such as indium tin oxide (ITO) or indium zinc oxide (IZO). The pixel electrode may be formed of a material having a light-blocking properties such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure in which the transparent conductive material and the material having light-blocking properties are laminated sequentially.

Between two adjacent pixel electrodes, a pixel define layer (PDL) overlapped with a terminal end of the pixel electrode to divide the pixel electrode into a pixel unit. The pixel define layer is an insulation layer which may electrically block the at least two pixel electrodes.

The pixel define layer covers a portion of the upper surface of the pixel electrode, and the remaining region of the pixel electrode not covered by the pixel define layer may provide an opening. An organic light emitting layer that will be described herein may be formed in the region defined by the opening.

The organic light emitting layer defines each pixel area by the aforementioned pixel electrode and the pixel define layer. In other words, one pixel area may be defined as an area formed with one organic light emitting unit layer which is contacted with one pixel electrode divided by the pixel define layer. In the display device according to an embodiment, the organic light emitting layer may be defined as a first pixel area, a second pixel area and a third pixel area, and each pixel area is spaced apart from each other leaving a predetermined interval by the pixel define layer.

In an embodiment, the organic light emitting layer may emit a third light belonging to a visible light region or belonging to an ultraviolet (UV) region. Each of the first to the third pixel areas of the organic light emitting layer may emit third light. In an embodiment, the third light may be a light having the highest energy in the visible light region, for example, may be blue light (and optionally green light). When all pixel areas of the organic light emitting layer are designed to emit the same light, each pixel area of the organic light emitting layer may be all formed of the same or similar materials or may show, e.g., exhibit, the same or similar properties. Thus a process of forming the organic light emitting layer may be simplified, and the display device may be easily applied for, e.g., made by, a large scale/large area process. However, the organic light emitting layer according to an embodiment is not necessarily limited thereto, but the organic light emitting layer may be designed to emit at least two different lights, e.g., at least two different colored lights.

The organic light emitting layer includes an organic light emitting unit layer in each pixel area, and each organic light emitting unit layer may further include an auxiliary layer (e.g., hole injection layer, hole transport layer, electron transport layer, etc.) besides the light emitting layer.

The common electrode may function as a cathode of the display device. The common electrode may be formed of a transparent conductive material such as indium tin oxide (ITO) or indium zinc oxide (IZO). The common electrode may be formed on the organic light emitting layer and may be integrated therewith.

A planarization layer or a passivation layer (not shown) may be formed on the common electrode. The planarization layer may include a (e.g., transparent) insulating material for ensuring electrical insulation with the common electrode. In an embodiment, the display device may further include a lower substrate, a polarizing plate disposed under the lower substrate, and a liquid crystal layer disposed between the laminated structure and the lower substrate, and in the laminated structure, the photoluminescence layer (i.e., light emitting layer) may be disposed to face the liquid crystal layer. The display device may further include a polarizing plate between the liquid crystal layer and the light emitting layer. The light source may further include LED and if desired, a light guide plate.

Figure 4:
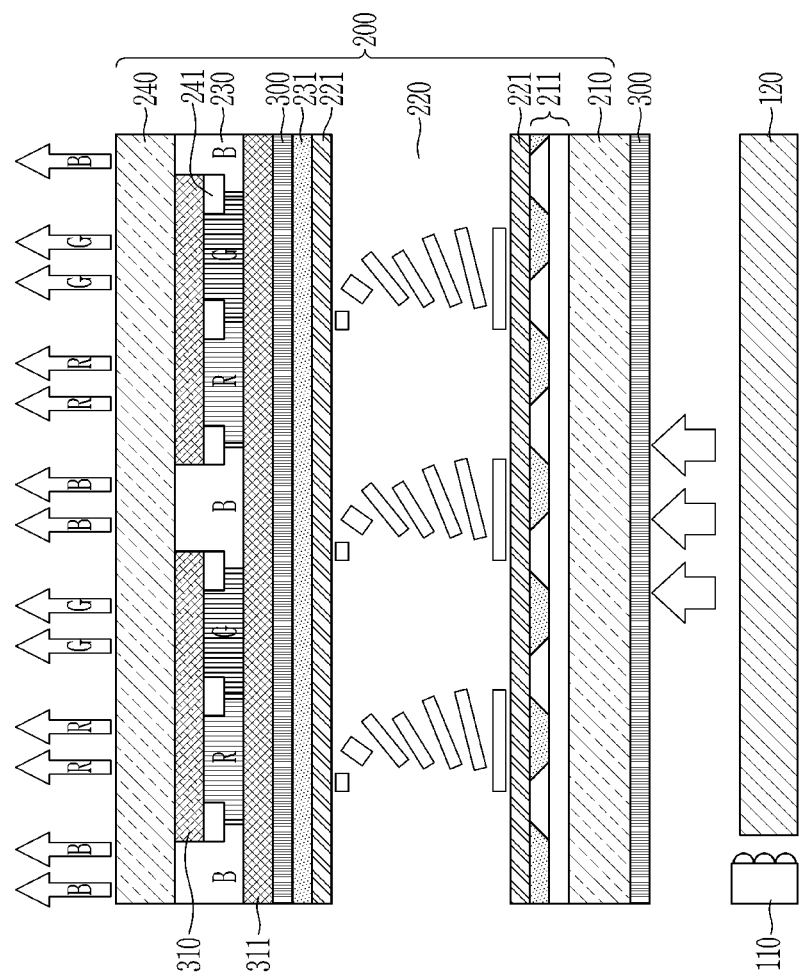
FIG. 4 is a schematic cross-sectional view of a display device according to an embodiment.

Non-limiting examples of the display device (e.g., a liquid crystal display device) according to an embodiment are illustrated with a reference to a drawing. FIG. 4 is a schematic cross sectional view showing a liquid crystal display according to an embodiment. Referring to FIG. 4, the display device of an embodiment includes a liquid crystal panel 200, a polarizing plate 300 disposed under the liquid crystal panel 200, and a backlight unit disposed under the polarizing plate 300.

The liquid crystal panel 200 includes a lower substrate 210, a stack structure, and a liquid crystal layer 220 disposed between the stack structure and the lower substrate. The stack structure includes a transparent substrate 240, a first optical filter layer 310, a photoluminescent layer 230 including a pattern of a quantum dot polymer composite, and a second optical filter layer 311.

The lower substrate 210 referred to as an array substrate may be a transparent insulation material substrate. The substrate is the same as described herein. A wire plate 211 is provided on an upper surface of the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are not particularly limited.

The liquid crystal panel 200 may include an alignment layer 221 on and under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal layer and the alignment layer are not particularly limited.

A lower polarizing plate 300 is provided under the lower substrate 210. Materials and structures of the polarizing plate 300 are not particularly limited. A backlight unit (e.g., emitting blue light) may be disposed under the polarizing plate 300. An upper optical element or the polarizing plate 300 may be provided between the liquid crystal layer 220 and the transparent substrate 240, but is not limited thereto. For example, the upper polarizing plate may be disposed between the liquid crystal layer 220 and the photoluminescent layer 230. The polarizing plate may be any suitable polarizer that used in a liquid crystal display device. The polarizing plate may be TAC (triacetyl cellulose) having a thickness of less than or equal to about 200 µm, but is not limited thereto. In an embodiment, the upper optical element may be a coating that controls a refractive index without a polarization function.

The backlight unit includes a light source 110. The light source 110 may emit blue light or white light. The light source 110 may include a blue LED, a white LED, a white OLED, or a combination thereof, but is not limited thereto.

The backlight unit may further include a light guide plate 120. In an embodiment, the backlight unit may be an edge-type lighting. For example, the backlight unit may include a reflector (not shown), a light guide plate (not shown) provided on the reflector and providing a planar light source with the liquid crystal panel 200, a, e.g., at least one, optical sheet (not shown) on the light guide plate, for example, a diffusion plate, a prism sheet, and the like, or a combination thereof, but is not limited thereto. The backlight unit may not include a light guide plate. In an embodiment, the backlight unit may be a direct lighting. For example, the backlight unit may have a reflector (not shown), and may have a plurality of fluorescent lamps disposed on the reflector at regular intervals, or may have an LED operating substrate on which a plurality of light emitting diodes may be disposed, a diffusion plate thereon, and optionally a, e.g., at least one, optical sheet. Details (e.g., each component of a light emitting diode, a fluorescent lamp, a light guide plate, various optical sheets, and a reflector) of such a backlight unit are not particularly limited.

A black matrix 241 is provided under the transparent substrate 240 and has openings and hides a gate line, a data line, and a thin film transistor of the wire plate on the lower substrate. For example, the black matrix 241 may have a lattice shape. The photoluminescent layer 230 is provided in the openings of the black matrix 241 and has a quantum dot composite pattern including a first section (R) configured to emit first light (e.g., red light), a second section (G) configured to emit second light (e.g., green light), and a third section (B) configured to emit/transmit, for example blue light. If desired, the photoluminescent layer 230 may further include a, e.g., at least one, fourth section. The fourth section may include a quantum dot that emits a light of different color from light emitted from the first to third sections (e.g., cyan, magenta, and yellow light).

In the photoluminescent layer 230, sections forming the pattern may be repeated corresponding to pixel areas formed on the lower substrate 210. A transparent common electrode 231 may be provided on the photoluminescent type color filter layer.

The third section (B) configured to emit/transmit blue light may be a transparent color filter that does not change an emission spectrum of the light source. In this case, blue light emitted from the backlight unit may enter in a polarized state and may be emitted through the polarizing plate and the liquid crystal layer as is. If desired, the third section may include a quantum dot emitting blue light.

As described herein, if desired, the display device or light emitting device of an embodiment may further have an excitation light blocking layer or a first optical filter layer (hereinafter referred to as a first optical filter layer). The first optical filter layer may be disposed between the bottom surface of the first section (R) and the second section (G) and the substrate (e.g., the upper substrate 240) or on the upper surface of the substrate. The first optical filter layer 310 may be a sheet having an opening in a region corresponding to a pixel area (a third section) displaying blue and thus formed in a region corresponding to the first and second sections. That is to say, the first optical filter layer may be disposed at the positions except the position overlapped with the third section and integrally therewith as shown in FIGS. 2A, 2B, and FIG. 3, but is not limited thereto. For example, at least two first optical filter layers may be disposed leaving a space at each position overlapped with the first and second sections. When the light source includes a green light emitting element, a green light blocking layer may be disposed on the third section.

The first optical filter layer may block (e.g., absorb) or substantially block light having, for example, a predetermined wavelength region in the visible light region and may transmit light in the other wavelength regions, and for example, the first optical filter layer may block blue light (or green light) and may transmit light except the blue light (or green light). The first optical filter layer may transmit, for example, green light, red light, and/or yellow light which is a mixed color thereof.

The first optical filter layer may substantially block excitation light and transmit light in a desired wavelength range. The transmittance of the first optical filter layer for the light in a desired wavelength range may be greater than or equal to about 70%, greater than or equal to about 80%, greater than or equal to about 90%, or even about 100%.

The first optical filter layer configured to selectively transmit red light may be disposed at a position overlapped with the red light emission section, and the first optical filter layer configured to selectively transmit green light may be disposed at a position overlapped with the green light emission section. The first optical filter layer may include a first region that blocks (e.g., absorb) blue light and red light and selectively transmits light of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm); a second region that blocks (e.g., absorb) blue light and green light and selectively transmits light of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm); or a combination thereof. When the light source emits blue and green mixed light, the first optical filter may further include a third region that selectively transmits blue light and blocks green light.

The first region may be disposed at a position overlapped with the green light emitting section. The second region may be disposed at a position overlapped with the red light emitting section. The third region may be disposed at a position overlapped with the blue light emitting section.

The first region, the second region, and, optionally, the third region may be optically isolated. Such a first optical filter layer may contribute to improvement of color purity of the display device.

The display device may further include a second optical filter layer (e.g., a red/green or yellow light recycle layer) 311 disposed between the photoluminescent layer and the liquid crystal layer (e.g., the photoluminescent layer and the upper polarizing plate, e.g., polarizer), transmitting at least a portion of third light (excitation light), and reflecting a, e.g., at least one, part of the first light, part of the second light, or part of each of the first light and second light. The first light may be red light, the second light may be green light, and the third light may be blue light. For example, the second optical filter layer may transmit only the third light (B) in a blue light wavelength region having a wavelength region of less than or equal to about 500 nm and light in a wavelength region of greater than about 500 nm, which is green light (G), yellow light, red light (R), or the like, may be not passed through the second optical filter layer and reflected. The reflected green light and red light may pass through the first and second sections and to be emitted to the outside of the display device.

The second optical filter layer or the first optical filter layer may be formed as an integrated layer having a relatively planar surface.

The first optical filter layer may include a polymer thin film including a dye absorbing light in a wavelength which is to be blocked, a pigment absorbing light in a wavelength which is to be blocked, or a combination thereof. The second optical filter layer and the first optical filter layer may include a single layer having a low refractive index, and may be, for example, a transparent thin film having a refractive index of less than or equal to about 1.4, less than or equal to about 1.3, or less than or equal to about 1.2. The second optical filter layer or the first optical filter layer having a low refractive index may be, for example, a porous silicon oxide, a porous organic material, a porous organic/inorganic composite, or a combination thereof.

The first optical filter layer or the second optical filter layer may include a plurality of layers having different refractive indexes. The first optical filter layer or the second optical filter layer may be formed by laminating two layers having different refractive indexes. For example, the first/second optical filter layer may be formed by alternately laminating a material having a high refractive index and a material having a low refractive index.

Figure 5A:
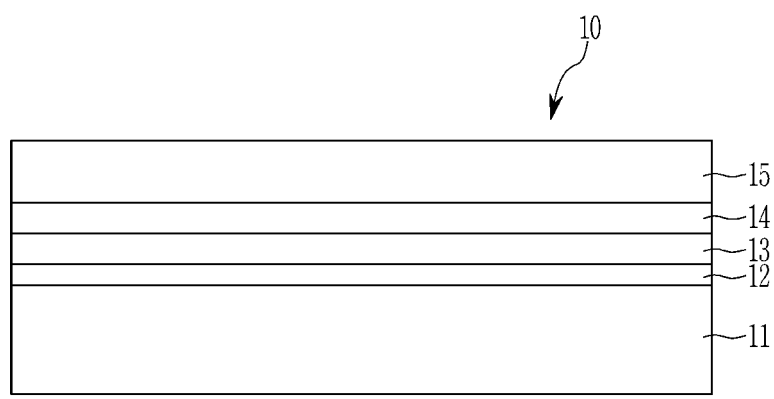
FIG. 5A is a schematic cross-sectional view of a light emitting device according to an embodiment.

Referring to FIG. 5A, the electronic device 10 includes a first electrode 11 and a second electrode 15 facing each other, an active layer 13 disposed between the first electrode 11 and the second electrode 15, and including the aforementioned quantum dots.

In an embodiment, the electronic device including the quantum dots may be an electroluminescent device. The quantum dots of the active layer 13 may be a light emitting layer in which electrons and holes injected from the first electrode 11 and the second electrode 15 are recombined to form excitons, and light of a constant wavelength by the energy of the formed excitons may be emitted. Also, the electronic device including the quantum dots may be a photodetector or a solar cell. Specifically, the active layer 13 may be a light absorbing layer in which the quantum dots absorb external photons and separates them into electrons and holes to provide electrons and holes to the first electrode 11 and the second electrode 15.

A hole auxiliary layer 12 may be disposed between the first electrode 11 and the active layer 13, and an electron auxiliary layer 14 may be disposed between the second electrode 15 and the active layer 13.

The electronic device 10 may further include a substrate (not shown). The substrate may be disposed at the side of the first electrode 11 or the second electrode 15. The substrate may be a substrate including an insulation material (e.g., an insulating transparent substrate). In addition, the substrate may include glass, various polymers such as polyester (e.g., polyethylene terephthalate (PET), polyethylene naphthalate (PEN)), polycarbonate, polyacrylate, polyimide, polyamide-imide, and the like, inorganic materials such as polysiloxane (e.g., PDMS), $Al_2O_3$, ZnO, and the like, or a combination thereof, or may be made of a silicon wafer. Herein, "transparent" may mean that transmittance through which light of a certain wavelength (e.g., light emitted from the quantum dots) passes is greater than or equal to about 85%, greater than or equal to about 88%, greater than or equal to about 90%, greater than or equal to about 95%, greater than or equal to about 97%, or greater than or equal to about 99%. A thickness of the substrate may be appropriately selected taking into consideration a substrate material, and the like, but is not particularly limited. The transparent substrate may have flexibility.

One of the first electrode 11 and the second electrode 15 may be an anode and the other may be a cathode. For example, the first electrode 11 may be an anode and the second electrode 15 may be a cathode.

The first electrode 11 may be made of a conductor, for example, a metal, a conductive metal oxide, or a combination thereof. The first electrode 11 may be, for example, made of a metal such as nickel, platinum, vanadium, chromium, copper, zinc, and gold or an alloy thereof, a conductive metal oxide such as zinc oxide, indium oxide, tin oxide, indium tin oxide (ITO), indium zinc oxide (IZO), or fluorine doped tin oxide, or a combination of a metal and an oxide such as ZnO and Al or $SnO_2$ and Sb, but is not limited thereto. The second electrode 15 may be made of a conductor, for example a metal, a conductive metal oxide, a conductive polymer, or a combination thereof. The second electrode 15 may be for example made of a metal such as aluminum, magnesium, calcium, sodium, potassium, titanium, indium, yttrium, lithium, gadolinium silver, gold, platinum, tin, lead, cesium, and barium or an alloy thereof, a multi-layered structure material such as LiF/Al, lithium oxide ($Li_2O$)/Al, 8-hydroxyquinolinato lithium (Liq)/Al, LiF/Ca, and $BaF_2$/Ca, but is not limited thereto. The conductive metal oxide is the same as described herein.

The work function of the first electrode 11 and the second electrode is not particularly limited, and may be appropriately selected. The work function of the first electrode 11 may be higher or lower than the work function of the second electrode 15.

The first electrode 11, the second electrode 15, or a combination thereof may be a light-transmitting electrode, and the light-transmitting electrode may be for example made of a conductive oxide such as zinc oxide, indium oxide, tin oxide, indium tin oxide (ITO), indium zinc oxide (IZO), or fluorine doped tin oxide, or a metal thin layer of a single layer or a multilayer. When one of the first electrode 11 and the second electrode 15 is a non-light-transmitting electrode, the non-light-transmitting electrode may be made of for example an opaque conductor such as aluminum (Al), silver (Ag), or gold (Au).

The thickness of the first electrode, second electrode, or each of the first and second electrodes is not particularly limited, and may be appropriately selected taking into consideration device efficiency. For example, the thickness of the electrodes may be greater than or equal to about 5 nm, for example, greater than or equal to about 50 nm and less than or equal to about 100 μm, for example, less than or equal to about 10 μm, less than or equal to about 1 μm, less than or equal to about 900 nm, less than or equal to about 500 nm, or less than or equal to about 100 nm.

The active layer 13 includes the quantum dots described herein. The active layer 13 may include quantum dot layers of a monolayer or a plurality of monolayers. The plurality of monolayer may be two layers or more, three layers or more, or four layers or more and 20 layers or less, 10 layers or less, 9 layers or less, 8 layers or less, 7 layers or less, or 6 layers or less. The active layer 13 may have a thickness of greater than or equal to about 5 nm, for example, greater than or equal to about 10 nm, greater than or equal to about 20 nm, or greater than or equal to about 30 nm, and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The active layer 13 may have a thickness of about 10 nm to about 150 nm about 10 nm to about 100 nm, or about 10 nm to about 50 nm.

The electronic device 10 may further include a hole auxiliary layer 12. The hole auxiliary layer 12 is disposed between the first electrode 11 and the active layer 13. The hole auxiliary layer 12 may include a hole injection layer (HIL), a hole transport layer (HTL), an electron blocking layer (EBL), or a combination thereof. The hole auxiliary layer 12 may be a single-component layer or a multilayer structure in which adjacent layers include different components.

The highest occupied molecular orbital (HOMO) energy level of the hole auxiliary layer 12 may have a HOMO energy level that may be matched with the HOMO energy level of the active layer 13 in order to enhance mobility of holes transferred from the hole auxiliary layer 12 to the active layer 13. For example, the hole auxiliary layer 12 may include a hole injection layer close to the first electrode 11 and a hole transport layer close to the active layer 13.

Materials included in the hole auxiliary layer 12 (e.g., a hole transport layer or a hole injection layer) are not particularly limited, but may for example include poly(9,9-dioctyl-fluorene-co-N-(4-butylphenyl)-diphenylamine) (TFB), polyarylamine, poly(N-vinylcarbazole) (PVK), poly (3,4-ethylenedioxythiophene) (PEDOT), poly(3,4-ethylene-dioxythiophene) polystyrene sulfonate (PEDOT:PSS), polyaniline, polypyrrole, N,N,N',N'-tetrakis (4-methoxyphenyl)-benzidine (TPD), 4-bis[N-(1-naphthyl)-N-phenyl-amino]biphenyl (α-NPD), 4,4',4"-tris[phenyl(m-tolyl) amino]triphenylamine (m-MTDATA), 4,4',4"-tris(N-carbazolyl)-triphenylamine (TCTA), 1,1-bis[(di-4-tolylamino)phenylcyclohexane (TAPC), a p-type metal oxide (e.g., NiO, $WO_3$, $MoO_3$, etc.), a carbon-based material such as graphene oxide, or a combination thereof, but are not limited thereto.

When the electron blocking layer (EBL) is used, the electron blocking layer (EBL) may include, for example, poly(3,4-ethylenedioxythiophene):poly(styrenesulfonate (PEDOT:PSS), poly(9,9-dioctyl-fluorene-co-N-(4-butylphenyl)-diphenylamine) (TFB), polyarylamine, poly (N-vinylcarbazole, polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

In the hole auxiliary layer(s), a thickness of each layer may be appropriately selected. For example, the thickness of each layer may be greater than or equal to about 5 nm, greater than or equal to about 10 nm, greater than or equal to about 15 nm, or greater than or equal to about 20 nm and less than or equal to about 50 nm, for example, less than or equal to about 40 nm, less than or equal to about 35 nm, or less than or equal to about 30 nm, but is not limited thereto.

The electronic auxiliary layer 14 may be disposed between the active layer 13 and the second electrode 15. The electron auxiliary layer 14 may include, for example, an electron injection layer (EIL) that facilitates injection of electrons, an electron transport layer (ETL) that facilitates electron transport, a hole blocking layer (HBL) that blocks hole movement, or a combination thereof. For example, an electron injection layer may be disposed between the electron transport layer and the cathode. For example, the hole blocking layer (HBL) may be disposed between the active layer and the electron transport (injection) layer, but is not limited thereto. For example, the thickness of each layer may be greater than or equal to about 1 nm and less than or equal to about 500 nm, but is not limited thereto. The electron injection layer may be an organic layer formed by vapor deposition and the electron transport layer may include inorganic oxide nanoparticles.

The electron transport layer (ETL) may include, for example 1,4,5,8-naphthalene-tetracarboxylic dianhydride (NTCDA), bathocuproine (BCP), tris[3-(3-pyridyl)-mesityl] borane (3TPYMB), LiF, tris(8-hydroxyquinolinato) aluminum ($Alq_3$), tris(8-hydroxyquinolinato) gallium ($Gaq_3$), tris (8-hydroxyquinolinato) indium ($Inq_3$), bis(8-hydroxyquinolinato) zinc ($Znq_2$), bis(2-(2-hydroxyphenyl) benzothiazolate) zinc ($Zn(BTZ)_2$), bis(10-hydroxybenzo[h] quinolinato) beryllium ($BeBq_2$), 8-(4-(4,6-di(naphthalen-2-yl)-1,3,5-triazin-2-yl)phenyl)quinolone (ET204), 8-hydroxyquinolinato lithium (Liq), an n-type metal oxide (e.g., ZnO, $HfO_2$, etc.), or a combination thereof, but is not limited thereto.

In addition, the electron transport layer (ETL) may include a plurality of nanoparticles. The nanoparticles may include metal oxides including zinc, for example, zinc oxide, zinc magnesium oxide, or a combination thereof. The metal oxide may include $Zn_{1-x}M_xO$ (wherein, M is Mg, Ca, Zr, W, Li, Ti, Y, Al, or a combination thereof and $0 \leq x \leq 0.5$). In the chemical formula, x may be greater than or equal to about 0.01 and less than or equal to about 0.3, for example, less than or equal to about 0.25, less than or equal to about 0.2, or less than or equal to about 0.15. An absolute value of lowest unoccupied molecular orbital (LUMO) of the aforementioned quantum dots included in the active layer may be smaller than an absolute value of LUMO of the metal oxide. An average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm.

The hole blocking layer (HBL) may include, for example, 1,4,5,8-naphthalene-tetracarboxylic dianhydride (NTCDA), bathocuproine (BCP), tris[3-(3-pyridyl)-mesityl]borane (3TPYMB), LiF, $Alq_3$, Gaq3, Inq3, Znq2, $Zn(BTZ)_2$, $BeBq_2$, or a combination thereof, but is not limited thereto.

each thickness of the electron auxiliary layer 14 (e.g., electron injection layer, electron transport layer, or hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm, and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

Figure 5B:
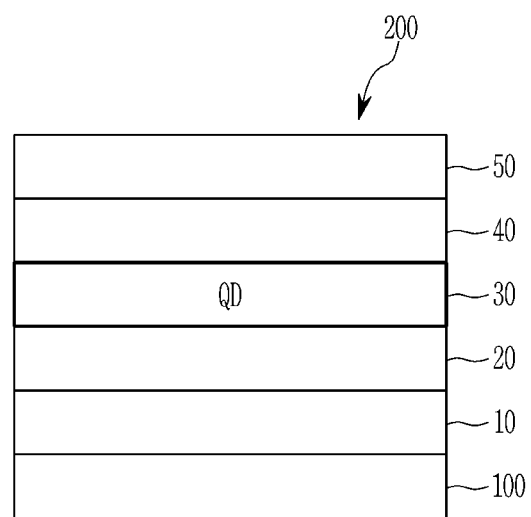
FIG. 5B is a schematic cross-sectional view of a light emitting device according to an embodiment.

Referring to FIG. 5B, a device according to an embodiment may have a normal structure. An electroluminescent device 200 may include an anode 10 disposed on the transparent substrate 100 and a cathode 50 facing the anode 10. The anode 10 may include a metal oxide-based transparent electrode, and the cathode 50 facing the anode 10 may include a conductive metal having a low work function. For example, the anode may include an indium tin oxide (ITO, work function of about 4.6 electronvolts (eV) to about 5.1 eV) electrode, and the cathode 50 may include an electrode including magnesium (Mg, work function of about 3.66 eV), aluminum (Al, work function of about 4.28 eV), or a combination thereof. Also, a hole auxiliary layer 20 may be disposed between the anode 10 and the quantum dot active layer 30. The hole auxiliary layer 20 may include a hole injection layer, a hole transport layer, or a combination thereof. The hole injection layer may be disposed close to the anode 10 and the hole transport layer may be disposed close to the quantum dot active layer. Also, the electron auxiliary layer 40 may be disposed between the quantum dot active layer 30 and the cathode 50. The electron auxiliary layer 40 may include an electron injection layer, an electron transport layer, or a combination thereof. The electron injection layer may be disposed close to the cathode 50 and the electron transport layer may be disposed close to the quantum dot active layer 30.

Figure 5C:
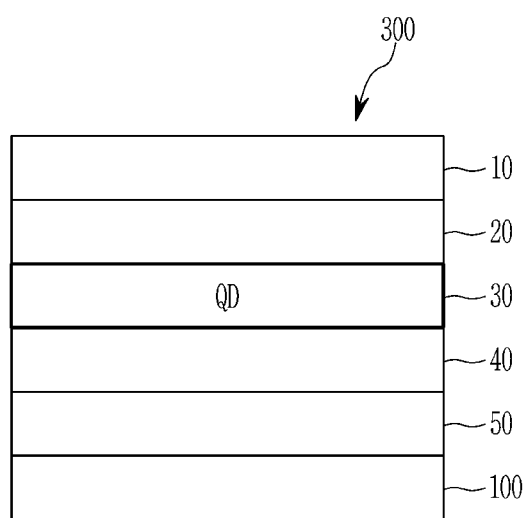
FIG. 5C is a schematic cross-sectional view of a light emitting device according to an embodiment.

Referring to FIG. 5C, a device according to an embodiment may have an inverted structure. The inverted electroluminescent device 300 may include a cathode 50 disposed on the transparent substrate 100 and an anode 10 facing the cathode 50. The cathode 50 may include a metal oxide-based transparent electrode, and the anode 10 facing the cathode 50 may include a conductive metal having a high work function. For example, the cathode 50 may be an indium tin oxide (ITO, work function of about 4.6 eV to 5.1 eV) electrode, the anode 10 may be an electrode including gold (Au, work function of about 5.1 eV), silver (Ag, work function of about 4.26), aluminum (Al, work function of 4.28 eV), or a combination thereof. Also, the electronic auxiliary layer 40 may be disposed between the quantum dot active layer 30 and the cathode 50. The electron auxiliary layer 40 may include an electron injection layer, an electron transport layer, or a combination thereof. The electron injection layer may be disposed close to the cathode 50 and the electron transport layer may be disposed close to the quantum dot active layer 30. The electron auxiliary layer 40 may include, for example, a metal oxide in the electron transport layer, and a crystalline Zn oxide or an n-type doped metal oxide. Also, a hole auxiliary layer 20 may be disposed between the anode 10 and the quantum dot active layer 30. The hole auxiliary layer 20 may include a hole injection layer, a hole transport layer, or a combination thereof. The hole injection layer may be disposed close to the anode 10, and the hole transport layer may be disposed close to the quantum dot active layer 30. The hole transport layer may include TFB, PVK, or a combination thereof, and the hole injection layer may include $MoO_3$ or other p-type metal oxides.

In the electroluminescent device, light of a certain wavelength generated in the active layer 30 is emitted to the outside through the light-transmitting electrode and the transparent substrate. For example, referring to FIG. 5B or FIG. 5C, when a metal oxide-based transparent electrode (e.g., indium tin oxide (ITO)), which is a light-transmitting electrode, is applied to the anode 10, the light formed in the active layer emitted to the outside through the anode 10 and the transparent substrate (100). Referring to FIG. 5B or FIG. 5C, when a metal oxide-based transparent electrode (e.g., indium tin oxide (ITO)), which is a light-transmitting electrode, is applied to the cathode 50, light formed in the active layer is emitted to the outside through the cathode 50 and the transparent substrate 100.

The aforementioned electronic device may be produced by a suitable method. For example, the electroluminescent device may be produced by forming a hole auxiliary layer (or an electron auxiliary layer) on a substrate on which an electrode is formed, forming an active layer including quantum dots (e.g., a pattern of the aforementioned quantum dots), and forming an electron auxiliary layer (or a hole auxiliary layer) and an electrode. The electrode, the hole auxiliary layer, and the electron auxiliary layer may each be independently formed by a suitable method, and may be formed, for example, by vapor deposition or coating, but are not particularly limited.

Hereinafter, embodiments are illustrated in more detail with reference to examples. However, they are exemplary examples of the present disclosure, and the present disclosure is not limited thereto.

EXAMPLES

Analysis Method
1. Photoluminescence Analysis
  (1) A photoluminescence (PL) spectrum of the produced nanocrystals are obtained using a Hitachi F-7000 spectrometer at an irradiation wavelength of 372 nanometers (nm).
  (2) A low temperature PL spectrum is obtained by further using a low temperature measurement accessory.
2. Ultraviolet (UV) Spectroscopy Analysis
  UV spectroscopy analysis is performed using an Agilent Cary 5000 spectrometer.
3. Inductively Coupled Plasma (ICP) Analysis
  An inductively coupled plasma-atomic emission spectroscopy (ICP-AES) analysis is performed using Shimadzu ICPS-8100.
4. X-Ray Photoelectron Spectroscopy (XPS) Analysis
  An X-ray photoelectron Spectroscopy analysis is performed using Quantum 2000 manufactured by Physical Electronics.
  Synthesis is performed under an inert gas atmosphere (or nitrogen flowing condition) unless particularly stated otherwise.
5. Thermogravimetric Analysis
  A thermogravimetric analysis is carried out by using TGA Q5000 V3.17 Build 265.
6. Transmission Electron Microscope-Energy Dispersive X-Ray Spectroscopy (TEM-EDX) Analysis
  A TEM-EDX analysis is carried out by using TGA Q5000 V3.17 Build 265.
  Synthesis is performed under an inert gas atmosphere (or nitrogen flowing condition) unless particularly stated otherwise.

Example 1

1. Selenium and tellurium are dispersed in trioctylphosphine (TOP) to obtain a 0.4 molar (M) Se/TOP stock solution and a 0.5 M Te/TOP stock solution, respectively. Then, prepared is a mixed solution including the Te/TOP stock solution, an organic ligand including oleyl amine, and lithium aluminum hydride.

In a 300 milliliters (mL) reaction flask, 0.9 mmol of zinc acetate is dissolved in octadecene and oleic acid is added. The reaction mixture (flask) is heated under vacuum at 120° C. After one hour at 120° C., the atmosphere in the flask is replaced with an inert gas (nitrogen), and the reaction flask is heated to 300° C.

To the heated reaction flask, the Se/TOP stock solution and the mixed solution are injected to carry out a core formation reaction. The reaction time for the core formation is about 2 minutes.

The reaction mixture is cooled to room temperature and then acetone is to added to facilitate the forming of a precipitate, which is separated via centrifugation to provide treated ZnTeSe cores (average diameter:about 3.2 nm). The treated ZnTeSe cores are then dispersed in toluene.

2. The zinc acetate is heated in the presence of oleic acid in trioctylamine (TOA) to prepare zinc precursor. One mole of lithium hexafluorophosphate is dissolved in acetonitrile to prepare an additive solution. Sulfur is dispersed in trioctylphosphine (TOP) to obtain a 1 molar (M) S/TOP stock solution.

To a 300 mL reaction flask, octadecene is placed and heated under vacuum at 120° C. for one hour. The atmosphere in the flask is replaced with an inert atmosphere (nitrogen), and during the period where the flask is heated to a temperature to greater than about 250° C., the prepared ZnTeSe cores, the additive solution, and the Se/TOP stock solution are added, and the reaction proceeds to form a ZnSe shell layer. Then, at the same temperature, the S/TOP stock solution is added and the reaction is carried out to form a ZnS shell layer.

The reaction time is about 60 minutes.

After the completion of the reaction, the flask is cooled to room temperature and acetone is added to facilitate formation of a precipitate, and the ZnTeSe/ZnSe/ZnS quantum dots are separated via centrifugation. The separated quantum dots are dispersed in toluene.

During the shell formation, with respect to the isolated core, an added amount of the Se and an added amount of the S are about 0.2 mmol and about 0.3 mmol, respectively.

3. Analysis

Figure 6:
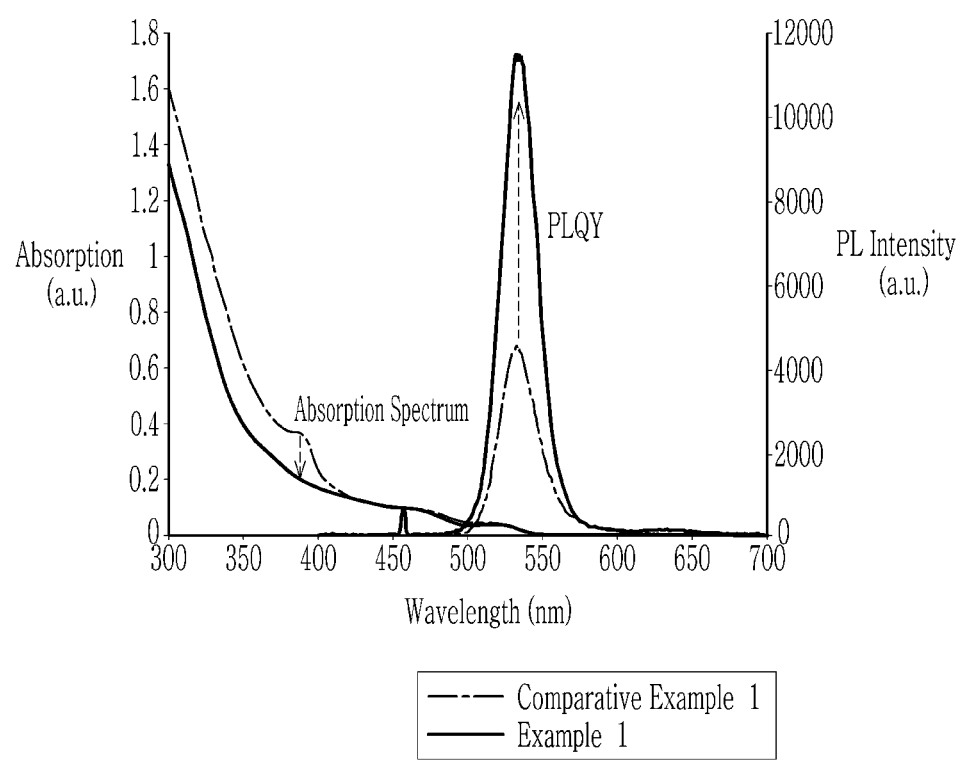
FIG. 6 is a graph of absorption (arbitrary units (a.u.)) and photoluminescence (PL) intensity (a.u.) versus wavelength (nm) showing ultraviolet-visible (UV-Vis) absorption spectra and luminescent spectra of the quantum dots prepared in Example 1 and Comparative Example 1.

With respect to the quantum dots as prepared, a UV-Vis absorption spectroscopy analysis and a photoluminescent spectroscopy analysis is conducted and the results are summarized in Table 1 and FIG. 6. With respect to the quantum dots, an ICP-AES analysis is conducted and the results are shown in Table 2.

Figure 7A:
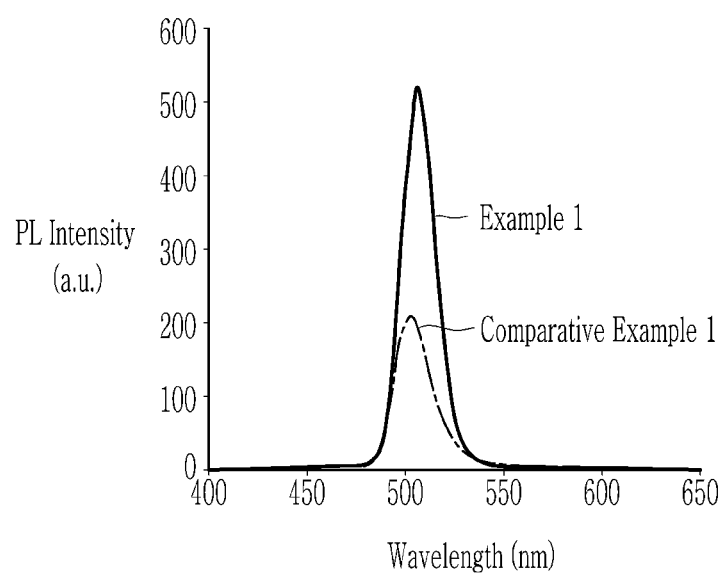
FIG. 7A is a graph of PL intensity (a.u.) versus wavelength (nm) showing low temperature luminescent spectra of the quantum dots prepared in Example 1 and Comparative Example 1.
Figure 7B:
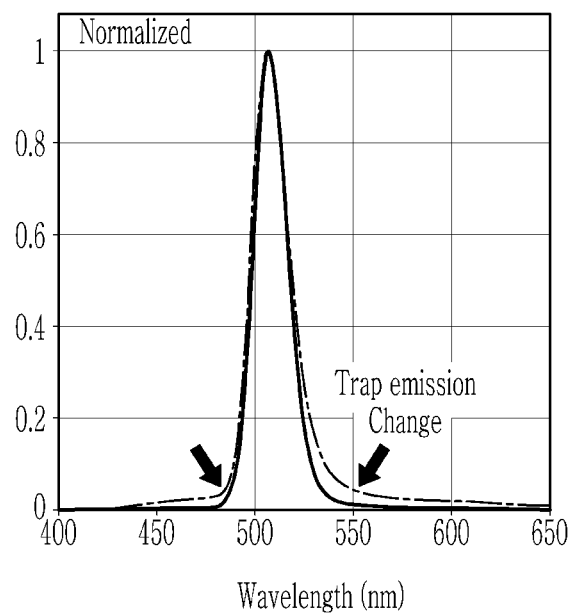
FIG. 7B is a graph of a normalized PL emission versus wavelength (nm) showing low temperature luminescent spectra of the quantum dots prepared in Example 1 and Comparative Example 1.

With respect to the quantum dots, a low temperature photoluminescent spectroscopy analysis is conducted and the results are shown in FIG. 7A and FIG. 7B.

Figure 8:
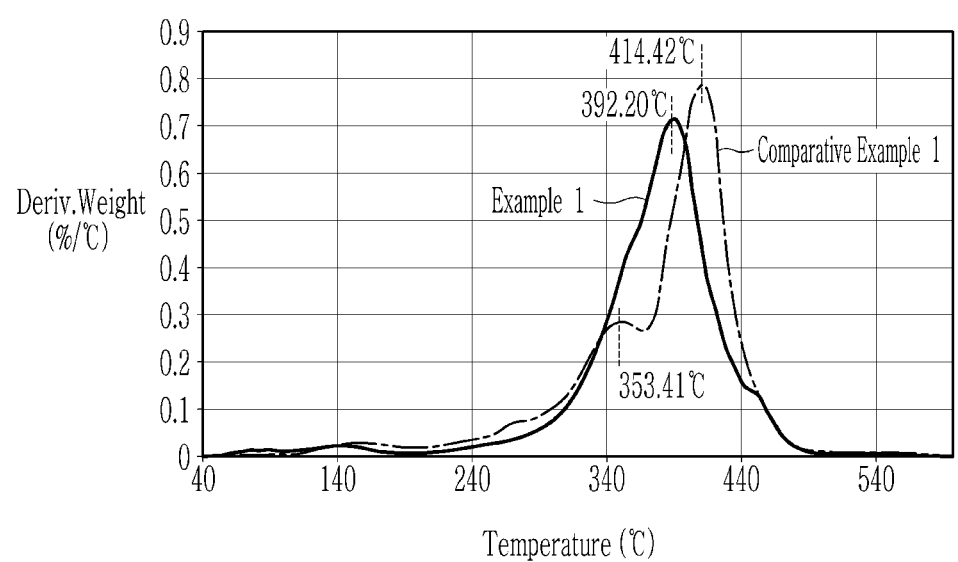
FIG. 8 is a graph of derivative weight (Deriv. Weight) (%/° C.) versus temperature (° C.) showing thermogravimetric analysis results for the quantum dots synthesized in Example 1 and Comparative Example 1.

With respect to the quantum dots, a thermogravimetric analysis is conducted and the results are shown in FIG. 8.

Figure 9:
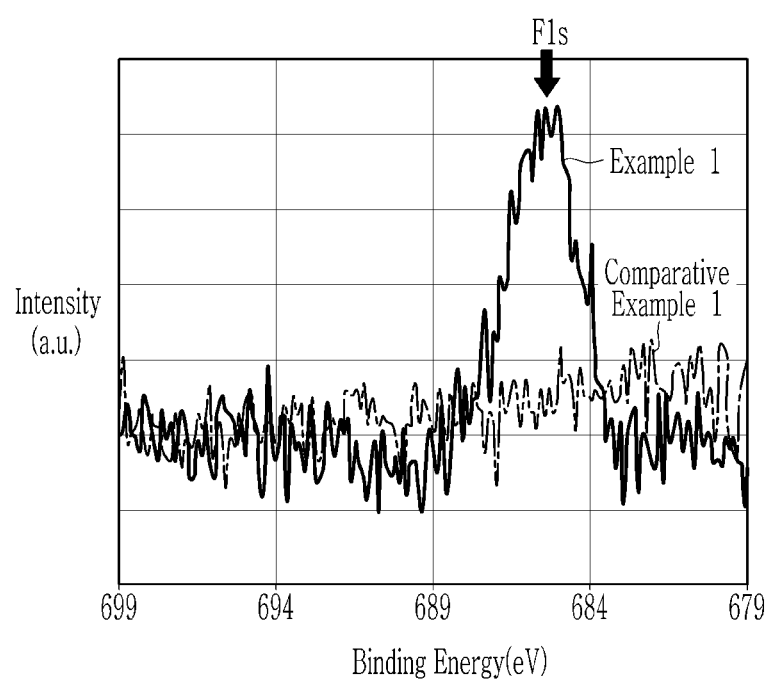
FIG. 9 is a graph of intensity (a.u.) versus binding energy (electronvolts (eV)) showing X-ray photoelectron spectroscopy (XPS) analysis of the quantum dot synthesized in Example 1 and Comparative Example 1.

With respect to the quantum dots, an XPS analysis is conducted and the results are shown in Table 3 and FIG. 9.

Comparative Example 1

1. A ZnTeSe/ZnSe/ZnS quantum dots are prepared in the same manner as in Example 1 except that in the shell formation, the additive solution is not used. The obtained core and the obtained core-shell quantum dots are dispersed in toluene.

2. A UV-Vis absorption spectroscopy analysis and a photoluminescent spectroscopy analysis are conducted with the quantum dots as prepared and the results are summarized in Table 1 and FIG. 6. With respect to the quantum dots, an ICP-AES analysis is conducted and the results are shown in Table 2. With respect to the quantum dots, a low temperature photoluminescent spectroscopy analysis is conducted and the results are shown in FIG. 7A and FIG. 7B.

With respect to the quantum dots, a thermogravimetric analysis is conducted and the results are shown in FIG. 8.

With respect to the quantum dots, an XPS analysis is conducted and the results are shown in Table 3 and FIG. 9.

TABLE 1

| | UV | Valley Depth (VD) | PL peak wavelength (nm) | Full Width at Half Maximum (FWHM) (nm) | Photoluminescent Quantum Yield (PLQY) (%) |
|---|---|---|---|---|---|
| Example 1 | 520 | 0.17 | 533 | 27.8 | 80.9 |
| Comparative Example 1 | 514 | 0.01 | 532 | 29.1 | 35.2 |

The results of Table 1 and FIG. 6 show that the quantum dots of Example 1 show significantly improved optical properties in comparison with the quantum dots of Comparative Example 1. The results of FIG. 7A and FIG. 7B show that a trap emission of the quantum dot of Example 1 prior to and after the PL peak wavelength may significantly decrease in comparison with that of the quantum dot of Comparative Example 1, indicating that the contribution of the defects in the emission may be reduced in the quantum dots of Example 1.

TABLE 2

| | ICP (Mole ratio relative to tellurium) | | | | |
|---|---|---|---|---|---|
| | Zn:Te | Se:Te | S:Te | Li:Te | P:Te |
| Example 1 | 3.80:1 | 1.20:1 | 0.22:1 | 1.230:1 | 0.754:1 |
| Comparative Example 1 | 4.74:1 | 2.15:1 | 0.76:1 | — | — |

The results of Table 2 confirm that the quantum dots of Example 1 further include phosphorus (P). The results of FIG. 8 show that the quantum dots of Example 1 have a surface state that is different from the quantum dots of Comparative Example 1.

TABLE 3

| | Atomic concentration (Atomic %) | | | | |
|---|---|---|---|---|---|
| | C1s | O1s | F1s | Zn2p$_{3/2}$ | Se3d |
| Comparative Example | 86.13 | 8.28 | 0 | 3.59 | 0.72 |
| Example 1 | 82.18 | 7.18 | 3.00 | 4.24 | 1.29 |

The results of Table 3 confirm that the quantum dots of Example 1 include fluorine.

Example 2-1 and Example 2-2

1. The cores are prepared in the same manner as in Example 1, except that the reaction time and the amount of the tellurium to obtain the cores of ZnTe$_x$Se$_{1-x}$ (x=0.69) having an average size of about 3.8 nm.

In the case of Example 2-1, the quantum dots are prepared in the same manner as in Example 1 except that the prepared cores are used and the ZnS shell is not formed.

In the case of Example 2-2, the quantum dots are prepared in the same manner as in Example 1 except that the prepared cores are added, the additive solution including PF$_6$ is added directly after the core injection, and then the temperature of the reaction system is raised.

A UV-Vis absorption spectroscopy analysis and a photoluminescent spectroscopy analysis are conducted with the quantum dots as prepared and the results are summarized in Table 4.

With respect to the quantum dots, an ICP-AES analysis is conducted and the results are shown in Table 5.

Example 3

1. The cores are prepared in the same manner as in Example 2-1, except that the reaction time and the amount of the tellurium are adjusted to obtain the cores of ZnTe$_x$Se$_{1-x}$ (x=0.62) having an average size of about 3.8 nm. The quantum dots are prepared in the same manner as in Example 2-1 except that the prepared cores are used.

2. A UV-Vis absorption spectroscopy analysis and a photoluminescent spectroscopy analysis are conducted with the quantum dots as prepared and the results are summarized in Table 4.

With respect to the quantum dots, an ICP-AES analysis is conducted and the results are shown in Table 5.

Comparative Example 2-1 and Comparative Example 2-2

The quantum dots are prepared in the same manner as in Example 1 except that the additive is not used, the core having the Te in an amount set forth in Table 4, and the shell having the composition set forth in Table 4 is used, respectively.

A UV-Vis absorption spectroscopy analysis and a photoluminescent spectroscopy analysis are conducted with the quantum dots as prepared and the results are summarized in Table 4.

With respect to the quantum dots, an ICP-AES analysis is conducted and the results are shown in Table 5.

TABLE 4

|  | core $ZnTe_xSe_{1-x}$, x value and shell composition | UV (nm) | VD | PL peak wavelength (nm) | FWHM (nm) | PLQY (%) |
|---|---|---|---|---|---|---|
| Example 2-1 | x = 0.69 ZnSe | 512 | 0.23 | 525 | 26.9 | 79.9 |
| Example 2-2 | x = 0.69 ZnSe/ZnS | 514 | 0.21 | 527 | 26.7 | 81.4 |
| Example 3 | x = 0.62 ZnSe/ZnS | 513 | 0.14 | 527 | 27.3 | 83.4 |
| Comparative Example 2-1 | x = 0.71 ZnSe | 510 | 0.08 | 526 | 27.1 | 26.2 |
| Comparative Example 2-2 | x = 0.71 ZnSe/ZnS | 514 | 0.01 | 532 | 29.1 | 35.2 |

TABLE 5

| | ICP (Mole ratio relative to tellurium) | | | | |
|---|---|---|---|---|---|
| | Zn:Te | Se:Te | S:Te | Li:Te | P:Te |
| Example 2-1 | 11.81:1 | 1.13:1 | 0.94:1 | 11.226:1 | 6.194:1 |
| Comparative Example 2-1 | 11:1 | 1.1:1 | 0.9:1 | — | — |

Example 4

1. The cores are prepared in the same manner as in Example 1, except that the reaction time and the amount of the tellurium to obtain the cores of $ZnTe_xSe_{1-x}$ (x=0.69) having an average size of about 3.4 nm.

The quantum dots are prepared in the same manner as in Example 1 except for using the prepared core and not using the sulfur precursor.

A UV-Vis absorption spectroscopy analysis and a photoluminescent spectroscopy analysis are conducted with the quantum dots as prepared and the results are summarized in Table 6.

With respect to the quantum dots, an ICP-AES analysis is conducted and the results are shown in Table 7.

TABLE 6

|  | core $ZnTe_xSe_{1-x}$ x value and shell composition | UV (nm) | VD | PL peak wavelength (nm) | FWHM (nm) | PLQY (%) |
|---|---|---|---|---|---|---|
| Example 4 | x = 0.53 ZnSe | 488 | 0.27 | 507 | 29.8 | 80.5 |

TABLE 7

| | ICP (Mole ratio relative to tellurium) | | | | |
|---|---|---|---|---|---|
| | Zn:Te | Se:Te | S:Te | Li:Te | P:Te |
| Example 4 | 6.59:1 | 1.18:1 | — | 0.384:1 | 0.390:1 |

Example 5

1. The cores are prepared in the same manner as in Example 1, except that the reaction time and the amount of the tellurium to obtain the cores of $ZnTe_xSe_{1-x}$ (x=0.67) having an average size of about 3 nm.

The quantum dots are prepared in the same manner as in Example 1 except for using the prepared core.

A UV-Vis absorption spectroscopy analysis and a photoluminescent spectroscopy analysis are conducted with the quantum dots as prepared and the results are summarized in Table 8.

Comparative Example 4

The quantum dots are prepared in the same manner as in Example 5 except for not using the additive solution.

A UV-Vis absorption spectroscopy analysis and a photoluminescent spectroscopy analysis are conducted with the quantum dots as prepared and the results are summarized in Table 8.

TABLE 8

|  | core $ZnTe_xSe_{1-x}$ x value and shell composition | PL peak wavelength (nm) | FWHM (nm) | PLQY (%) |
|---|---|---|---|---|
| Example 5 | x = 0.67 ZnSe/ZnS | 538 | 36.4 | 82.8 |

TABLE 8-continued

| | core $ZnTe_xSe_{1-x}$ x value and shell composition | PL peak wavelength (nm) | FWHM (nm) | PLQY (%) |
|---|---|---|---|---|
| Comparative Example 4 | x = 0.67 ZnSe/ZnS | 539 | 40.3 | 35 |

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot comprising:
zinc,
selenium, and
tellurium,
wherein the quantum dot has a core-shell structure comprising
a core comprising a first semiconductor nanocrystal, and
a semiconductor nanocrystal shell disposed on the core, the semiconductor nanocrystal shell comprising a Group II-VI compound,
wherein the quantum dot further comprises
phosphorus, and
fluorine,
the quantum dot does not comprise cadmium, and
wherein the first semiconductor nanocrystal comprises a first zinc chalcogenide comprising zinc, tellurium, and selenium,
wherein a maximum luminescent peak of the quantum dot has a full width at half maximum of less than 40 nanometers and
wherein in the quantum dot, a mole ratio of phosphorus with respect to tellurium is greater than or equal to about 0.05:1.

2. The quantum dot of claim 1, wherein the quantum dot is configured to emit green light.

3. The quantum dot of claim 1, a mole ratio of tellurium with respect to selenium is greater than or equal to about 0.3:1.

4. The quantum dot of claim 1, wherein
the Group II-VI compound comprises a second zinc chalcogenide, and
the second zinc chalcogenide comprises
zinc, and
selenium, sulfur, tellurium, or a combination thereof.

5. The quantum dot of claim 1, wherein in the quantum dot, a mole ratio of tellurium with respect to selenium is greater than or equal to about 0.3:1.

6. The quantum dot of claim 1, wherein in the quantum dot, an amount of fluorine is greater than or equal to about 0.1 atomic percent, as measured by an X-ray photoelectron spectroscopy analysis.

7. The quantum dot of claim 1, wherein the quantum dot further comprises an alkali metal, aluminum, or a combination thereof.

8. The quantum dot of claim 7, wherein in the quantum dot, a mole ratio of the alkali metal with respect to tellurium is greater than or equal to about 0.01:1.

9. The quantum dot of claim 1, wherein the quantum dot does not comprise an indium phosphide, a gallium phosphide, or a combination thereof.

10. The quantum dot of claim 1, wherein the quantum dot has a maximum peak wavelength in a range of from about 480 nanometers to about 560 nanometers.

11. The quantum dot of claim 1, wherein a maximum luminescent peak of the quantum dot has a full width at half maximum of less than or equal to 39 nanometers.

12. The quantum dot of claim 1, the quantum dot has a quantum efficiency of greater than or equal to about 60%.

13. The quantum dot of claim 1, wherein the quantum dot comprises an organic ligand and the organic ligand comprises RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', RHPO(OH), $RPO(OH)_2$, $R_2POOH$, a polymeric organic ligand, or a combination thereof, wherein R and R' are the same or different, and are each independently a substituted or unsubstituted C1 to C40 aliphatic hydrocarbon group, a substituted or unsubstituted C6 to C40 aromatic hydrocarbon group, or a combination thereof.

14. A method of manufacturing the quantum dot of claim 1, the method comprising:
reacting a Group II metal precursor and a chalcogen element precursor in the presence of the core and a first organic ligand in a first organic solvent to form the semiconductor nanocrystal shell on the core;
wherein the reaction is carried out in the presence of an additive comprising phosphorus and fluorine.

15. The method of claim 14, wherein the additive further comprises an alkali metal.

16. The method of claim 14, wherein the additive comprises a compound represented by the chemical formula:

$M^+PF_6^-$ wherein M is lithium, sodium, potassium, cesium, rubidium, or a combination thereof.

17. A quantum dot composite comprising
a matrix, and
a plurality of quantum dots dispersed in the matrix,
wherein the plurality of quantum dots comprises the quantum dot of claim 1.

18. A display device comprising
a light emitting element,
wherein the light emitting element comprises a plurality of core shell quantum dots, wherein the plurality of quantum dots comprises the quantum dot of claim 1.

19. An electronic device comprising:
a first electrode and a second electrode each having a surface opposite the other, and
an active layer disposed between the first electrode and the second electrode, the active layer comprising a plurality of quantum dots, wherein the plurality of quantum dots comprises the quantum dot of claim 1.

* * * * *